United States Patent
Chun et al.

(10) Patent No.: US 12,277,995 B2
(45) Date of Patent: Apr. 15, 2025

(54) PAGE BUFFER CIRCUIT AND MEMORY DEVICE INCLUDING THE SAME

(71) Applicant: SAMSUNG ELECTRONICS CO., LTD., Suwon-si (KR)

(72) Inventors: Jin-Young Chun, Suwon-si (KR); Minjae Seo, Suwon-si (KR); Moosung Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 204 days.

(21) Appl. No.: 17/988,797

(22) Filed: Nov. 17, 2022

(65) Prior Publication Data
US 2023/0154505 A1    May 18, 2023

(30) Foreign Application Priority Data

Nov. 17, 2021  (KR) .................. 10-2021-0158734
Jun. 3, 2022    (KR) .................. 10-2022-0068256

(51) Int. Cl.
G11C 7/10   (2006.01)
G11C 7/12   (2006.01)
G11C 7/20   (2006.01)

(52) U.S. Cl.
CPC .............. *G11C 7/12* (2013.01); *G11C 7/1039* (2013.01); *G11C 7/1069* (2013.01); *G11C 7/20* (2013.01)

(58) Field of Classification Search
CPC ....... G11C 7/12; G11C 7/1039; G11C 7/1069; G11C 7/20
See application file for complete search history.

(56) References Cited

U.S. PATENT DOCUMENTS

| | | | |
|---|---|---|---|
| 7,079,434 B2 | 7/2006 | Ha | |
| 7,177,201 B1 | 2/2007 | Takayanagi | |
| 8,339,875 B2 | 12/2012 | Tuyls et al. | |
| 8,659,322 B2 | 2/2014 | Hoefler et al. | |
| 9,281,048 B2 | 3/2016 | Kim et al. | |
| 9,966,956 B2 | 5/2018 | Lim | |
| 11,069,396 B2* | 7/2021 | Choi | G11C 16/32 |
| 2007/0147120 A1* | 6/2007 | Kim | G11C 7/106 |
| | | | 365/189.05 |
| 2021/0090620 A1* | 3/2021 | Yang | G11C 7/1087 |

FOREIGN PATENT DOCUMENTS

KR         2122464 B1      6/2020

* cited by examiner

*Primary Examiner* — Min Huang
(74) *Attorney, Agent, or Firm* — Fish & Richardson P.C.

(57) ABSTRACT

A non-volatile memory device includes: a memory cell; a bit line connected to the memory cell; a first cross coupled inverter for storing data sensed from the memory cell through a sensing node connected to the bit line; a first transistor and a second transistor respectively connected to respective ends of the first cross coupled inverter and respectively transmitting a ground voltage to respective ends of the first cross coupled inverter; and a control circuit for operating the first transistor and the second transistor at least once for at least one of an initialize period in which the sensing node is discharged and a precharge period in which the bit line is precharged.

17 Claims, 15 Drawing Sheets

PAGE BUFFER CIRCUIT AND MEMORY DEVICE INCLUDING THE SAME

CROSS-REFERENCE TO RELATED APPLICATION

This application claims priority to and the benefit of Korean Patent Application No. 10-2021-0158734 filed in the Korean Intellectual Property Office on Nov. 17, 2021, and priority to and the benefit of Korean Patent Application No. 10-2022-0068256 filed in the Korean Intellectual Property Office on Jun. 3, 2022, the entire contents of which are incorporated herein by reference.

BACKGROUND

(a) Field

The present disclosure relates to a page buffer circuit and a memory device including the page buffer circuit.

(b) Description of the Related Art

A semiconductor memory device may be classified into a volatile semiconductor memory device and a non-volatile semiconductor memory device. The volatile semiconductor memory device has fast read and write rates, but stored contents disappear when power supply is stopped. On the contrary, the non-volatile semiconductor memory device preserves the contents when the power supply is stopped. Therefore, the non-volatile semiconductor memory device is used to store the contents to be stored regardless of whether the power is supplied or not.

Recently, as information communication devices have multiple functions, large capacity, higher integration, and low power consumption of the volatile memory devices and the non-volatile memory devices are required. Particularly, as the components become smaller in size, performance or reliability issues of the semiconductor devices are degraded because of various component degradation phenomena.

SUMMARY

Some embodiments may provide a non-volatile semiconductor device for minimizing generation of error bits and having high reliability.

Some embodiments may provide a non-volatile semiconductor device for performing an initialization operation of a page buffer.

An embodiment provides a non-volatile memory device including: a memory cell; a bit line connected to the memory cell; a first cross coupled inverter for storing data sensed from the memory cell through a sensing node connected to the bit line; a first transistor and a second transistor respectively connected to respective ends of the first cross coupled inverter and respectively transmitting a ground voltage to respective ends of the first cross coupled inverter; and a control circuit for operating the first transistor and the second transistor at least once within at least one of an initialize period in which the sensing node is discharged and a precharge period in which the bit line is precharged.

Another embodiment provides a non-volatile memory device including: a memory cell; a bit line connected to the memory cell; a cross coupled inverter for storing data sensed from the memory cell through a sensing node connected to the bit line as a latch value; a first transistor for connecting a first end of the cross coupled inverter to ground when the sensing node is connected to ground according to the latch value; and a second transistor for connecting a second end of the cross coupled inverter to ground when a voltage at the sensing node is maintained according to the latch value.

Another embodiment provides a method for driving a non-volatile memory device, the method including: connecting a sensing node, which is connected to a bit line of a memory cell, to ground and discharging the sensing node within an initialize period; precharging the bit line for a precharge period; sensing data stored in the memory cell by using a first cross coupled inverter connected to the sensing node; and respectively operating, at least once, a first transistor and a second transistor connected to respective ends of the first cross coupled inverter and respectively transmitting a ground voltage to the respective ends of the first cross coupled inverter within at least one of the initialize period and the precharge period.

DETAILED DESCRIPTION OF THE EMBODIMENTS

Figure 1:
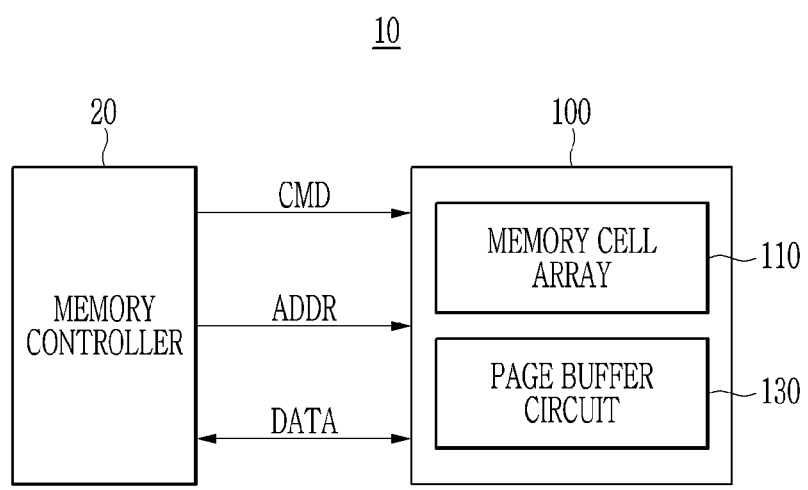
FIG. 1 shows a block diagram of a memory system according to an embodiment.

In the following detailed description, only certain embodiments have been shown and described, simply by way of illustration. As those skilled in the art would realize, the described embodiments may be modified in various different ways, all without departing from the spirit or scope.

Accordingly, the drawings and description are to be regarded as illustrative in nature and not restrictive and like reference numerals designate like elements throughout the specification. In the flowcharts described with reference to the drawings in this specification, various operations may be merged, certain operations may be divided, and specific operations may not be performed.

FIG. 1 shows a block diagram of a memory system according to an embodiment.

Referring to FIG. 1, the memory system 10 includes a memory device 100 and a memory controller 20. In an embodiment, the memory device 100 and the memory controller 20 may be connected through a memory interface and may transmit/receive signals through the memory interface.

The memory device 100 includes a memory cell array 110 and a page buffer circuit 130. The memory device 100 may have a C2C (Chip to Chip) structure. Here, the C2C structure may signify that at least one upper chip including a cell area CELL and a lower chip including a peripheral circuit area PERI are respectively manufactured and the at least one upper chip and the lower chip are connected to each other by a bonding method. In an embodiment, the bonding method may signify the method of electrically connecting the bonding metal formed on an uppermost metal layer of the upper chip and the bonding metal formed on an uppermost metal layer of the lower chip. For example, when the bonding metal is made of copper (Cu), the bonding method may be a Cu—Cu bonding method. For another example, the bonding metal may be formed of aluminum (Al) or tungsten (W). A configuration of the memory device 100 will be described in detail with reference to FIG. 14.

The memory cell array 110 includes a plurality of memory cells. The page buffer circuit 130 may be operated as a write driver for writing data in the cell array 110 or a sense amplifier for reading the data stored in the cell array 110.

The memory controller 20 controls an operation of the memory device 100 by providing signals to the memory device 100. For example, the signals may include commands CMD and addresses ADDR. In an embodiment, the memory controller 20 may provide the commands CMD and the addresses ADDR to the memory device 100 to access the memory cell array 110 and control the memory operation such as read or write. The data DATA may be transmitted to the memory controller 20 from the memory cell array 110 according to the read operation, and the data DATA may be transmitted to the memory cell array 110 from the memory controller 20 according to the write operation.

The commands CMD may include an initialize command and a read/write command. The initialize command may be a command for removing the data stored in the page buffer circuit 130 before reading data from the memory cell array 110. The read/write command may be a command for reading data from a target memory cell or writing data to the target memory cell.

Figure 2:
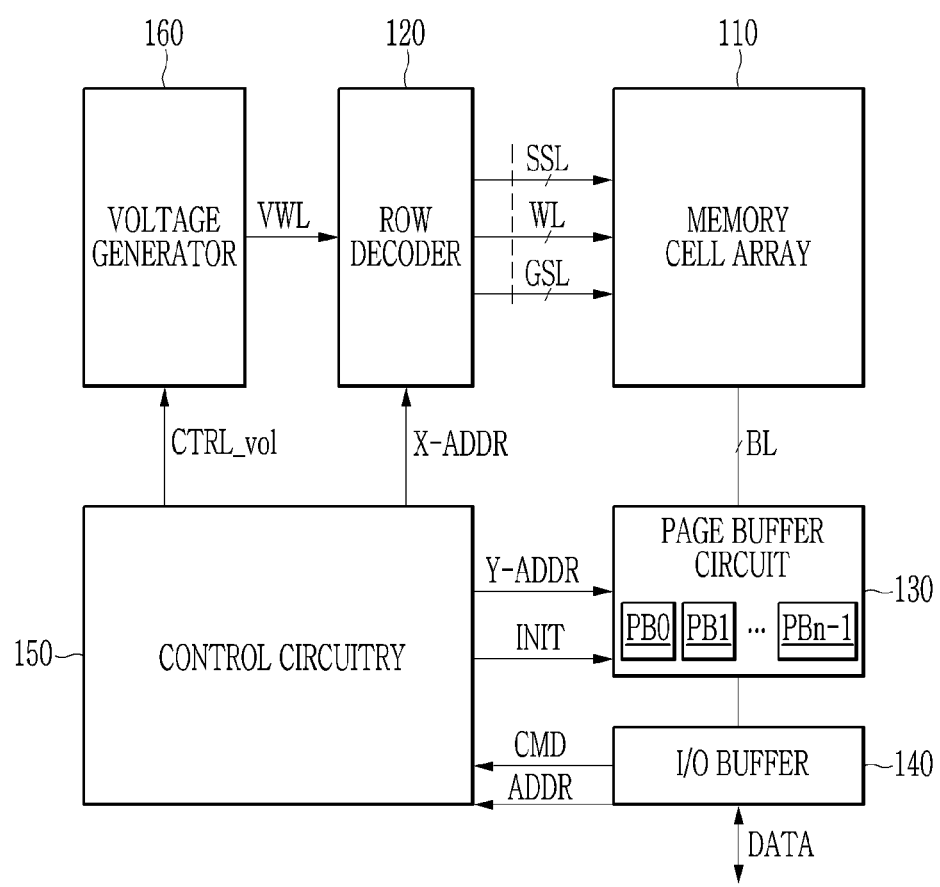
FIG. 2 shows a block diagram of a memory device according to an embodiment.

FIG. 2 shows a block diagram of a memory device according to an embodiment.

Referring to FIG. 2, the memory device 100 may include a memory cell array 110, a row decoder 120, a page buffer circuit 130, an input and output buffer 140, a control circuit 150, and a voltage generator 160.

The memory cell array 110 includes a plurality of memory cells defined by a plurality of rows and a plurality of columns. In an embodiment, the row may be defined by a word line WL, and the column may be defined by a bit line BL.

The memory cell array 110 is connected to the row decoder 120 through the word line WL or select lines SSL and GSL. The cell array 110 is connected to the page buffer circuit 130 through the bit line BL. The cell array 110 includes a plurality of NAND cell strings. Respective channels of the cell strings may be formed in a perpendicular or horizontal direction. The cell array 110 may include a plurality of memory cells forming the NAND cell strings.

The memory cells may be read and written by a voltage supplied by at least one of the bit line BL and the word line WL.

In an embodiment, the cell array 110 may include a 3-dimensional (3D) memory cell array. The 3D memory cell array may include a plurality of NAND strings, and the respective NAND strings may include memory cells respectively connected to the word lines WL perpendicularly stacked on the substrate. However, the present disclosure is not limited thereto, and the memory cell array 110 may include a 2-dimensional (2D) memory cell array in an embodiment.

The row decoder 120 may select one memory block of the cell array 110 in response to the X address signal X-ADDR received from the control circuit 150. The memory block includes a plurality of memory cells connected to one word line WL. In other words, the row decoder 120 may select one of a plurality of word lines WL in response to the X address signal X-ADDR. The row decoder 120 may transmit the voltage that corresponds to the operation of the memory block to the selected word line WL of the memory block. The page buffer circuit 130 may be connected to the memory cell array 110 through the bit line BL. The page buffer circuit 130 may include the page buffer PB that corresponds to the respective bit lines BL. The page buffer circuit 130 senses the data stored in the memory cell selected through the bit line BL at the time of a read operation. A method for the page buffer circuit 130 to sense the data of the memory cell will be described with reference to FIG. 6.

Further, the page buffer circuit 130 transmits the bit line BL voltage that corresponds to data to be programmed through the bit line BL of the cell array 110 at the time of a program operation. In detail, a plurality of page buffers PB0 to PBn-1 respectively setup or precharge a sensing node. The page buffers PB0 to PBn-1 respectively store the data to be programmed in a latch and precharge the bit line BL. The page buffers PB0 to PBn-1 respectively transmit the data stored in the latch to the cell array 110 through the bit line BL.

The input and output buffer 140 may provide data DATA provided by an external device to the page buffer circuit 130. The input and output buffer 140 may output the data latched by the page buffer circuit 130 to the external device. The input and output buffer 140 may provide the command CMD and the address ADDR provided by the external device to the control circuit 150.

The control circuit 150 controls the row decoder 120, the page buffer circuit 130, and the voltage generator 160 in response to the command CMD and the address ADDR transmitted from the external device. The control circuit 150 may use control signals to control the row decoder 120, the page buffer circuit 130, and the voltage generator 160. For example, the address ADDR may include an X address signal X-ADDR and a Y address signal Y-ADDR.

For example, the control signals may include an initialization signal INIT, an X address signal X-ADDR, a Y address signal Y-ADDR, and a voltage control signal CTRL_vol. The control circuit 150 may control the page buffer circuit 130 to perform a read operation and a write operation to the memory cell selected by the row decoder 120 by using the control signals.

The control circuit 150 controls the page buffer circuit 130 to initialize the page buffer circuit 130 by using the initialization signal INIT.

The voltage generator 160 generates various types of word line voltages VWL to be supplied to the respective word lines WL and a voltage to be supplied to a bulk (e.g., a well region) in which memory cells are formed according to a voltage control signal CTRL_vol of the control circuit 150.

Figure 3:
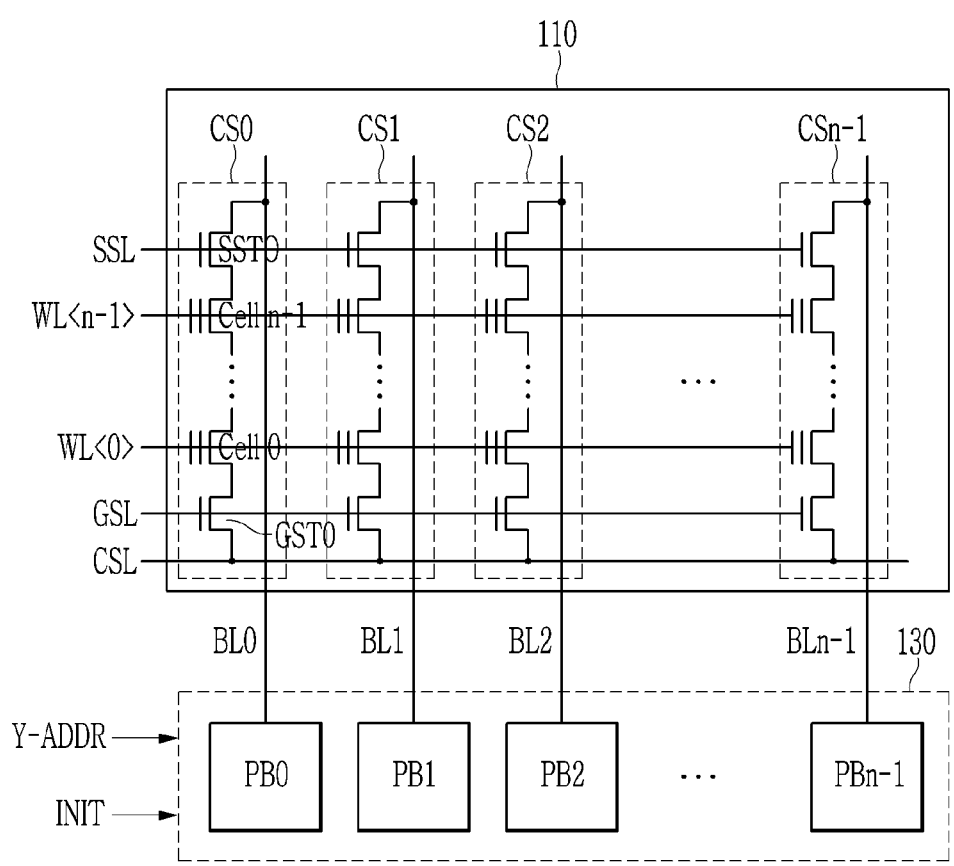
FIG. 3 shows a block diagram of a configuration of a cell array and a page buffer according to an embodiment.

FIG. 3 shows a block diagram of a configuration of a cell array and a page buffer.

The memory cell array 110 may include a plurality of cell strings CS0 to CSn-1.

The cell strings CS0 to CSn-1 may be connected to a string select line SSL, a plurality of word lines WL0 to WLn-1, a ground select line GSL, and a common source line CSL. From among the cell strings CS0 to CSn-1, the cell string CS0 includes a string select transistor SST0, a plurality of memory cells Cell0 to Celln-1, and a ground select transistor GST0. When the string select transistor SST0 is turned on by the signal transmitted through the string select line SSL, the cell string CS0 may be connected to the corresponding bit line BL0.

The other cell strings CS1 to CSn-1 may be configured in a like way of the cell string CS0 and may be connected to the corresponding bit lines BL1 to BLn-1.

The cell string CS0 may be connected to the common source line CSL through the ground select transistor GST0 driven by the ground select line GSL.

The other cell strings CS1 to CSn-1 may be connected to the common source line CSL in a same way of the cell string CS0.

The bit lines BL0 to BLn-1 may be respectively connected to a plurality of page buffers PB0 to PBn-1.

Figure 4:
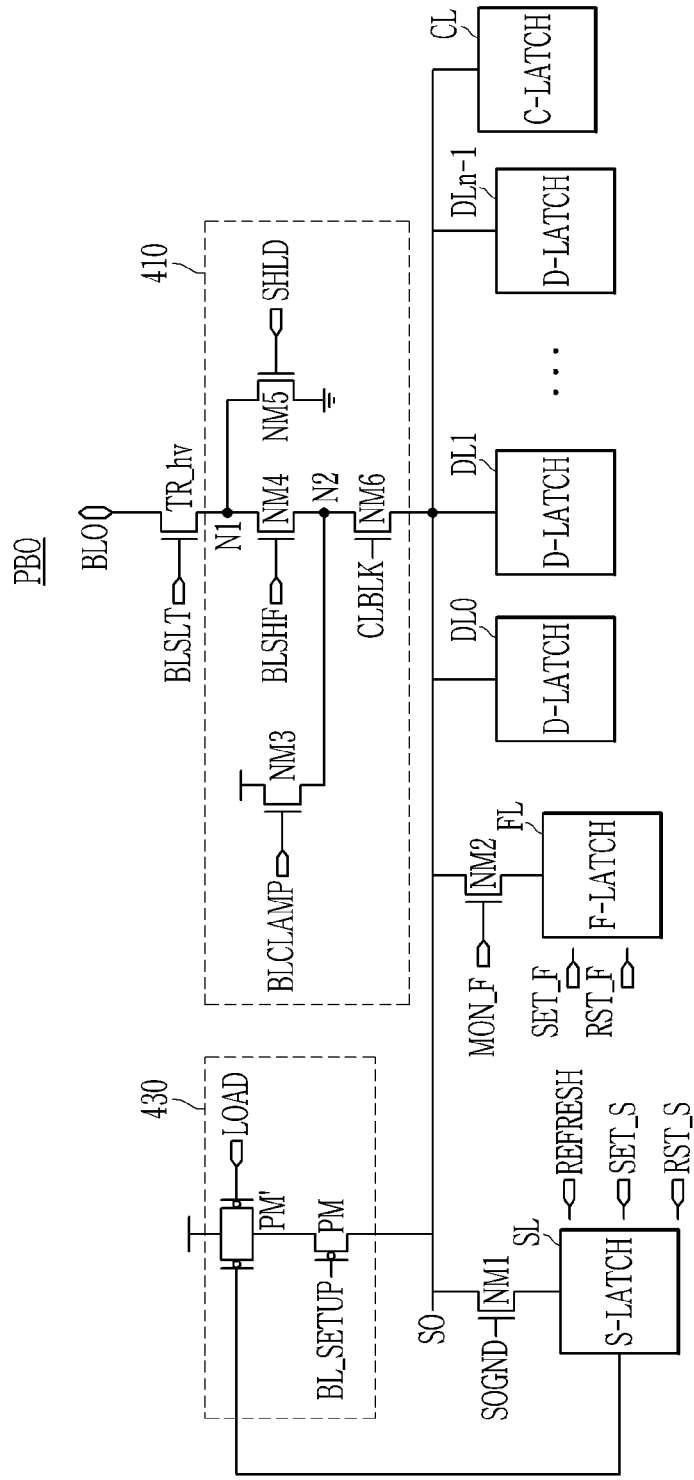
FIG. 4 shows a block diagram of a configuration of a page buffer according to an embodiment.

FIG. 4 shows a block diagram of a configuration of a page buffer according to an embodiment.

The page buffer PB0 may be connected to the bit line BL0 and may be connected to the memory cells of the NAND cell string CS0.

The page buffer PB0 may include a bit line select transistor Tr_hv. The bit line select transistor Tr by is connected between the bit line BL0 and the first node N1 and is controlled by a bit line selection signal BLSLT. The bit line select transistor Tr_hv may be realized with a high voltage transistor.

The page buffer PB0 may include latches SL, FL, DL0, DL1, ..., DLn-1, CL, a connection circuit for connecting the bit line BL0 and the latches SL, FL, DL0, DL1, ..., DLn-1, CL, and a precharge circuit. The precharge circuit precharges the bit line BL0 or the sensing node SO to read data from the memory cell or write data to the memory cell. The page buffer may include a plurality of semiconductor devices for realizing the above-noted circuits.

The sensing latch SL may sense sensing results of the data stored in the memory cell and may store the same as a latch value at the time of the read operation.

A forcing latch FL may be used to improve threshold voltage dispersion at the time of the program operation. In detail, the forcing latch FL stores force data. When a threshold voltage of the memory cell enters a forcing region that does not reach a target region from among the program operation, a force data value stored in the forcing latch FL may be changed. The forcing latch FL controls the bit line BL voltage during the program operation by using the force data so the program threshold voltage dispersion may be formed to be narrower than the case of using no forcing latch FL.

In an embodiment, in a like way of the sensing latch, the forcing latch may sense the sensing result of the data stored in the memory cell and may store the same as a latch value at the time of the read operation. In this case, the sensing latch may not operate, and the forcing latch may operate.

In an embodiment, the forcing latch may force a sensing result by receiving the sensing result stored in the sensing latch.

A plurality of data latches DL0, DL1, ..., DLn-1 may be used to store the sensed value that is sensed by the sensing latch SL or may be used to store the data input by the external device at the time of the program operation. The number of the data latches may be changeable depending on embodiments.

A cache latch CL may receive the sensing result of the data stored in the memory cell from the sensing latch SL and may output the same to the external device through the input and output buffer marked as 140 in FIG. 2.

The sensing latch SL, the forcing latch FL, the data latches DL0, DL1, ..., DLn-1, and the cache latch CL may be connected to each other through the sensing node SO.

The page buffer PB0 may include a first transistor NM1 and a second transistor NM2. The first transistor NM1 may be connected between the sensing node SO and the sensing latch SL and may be controlled by a ground control signal SOGND. The second transistor NM2 may be connected between the sensing node SO and the forcing latch FL and may be controlled by a forcing monitoring signal MON_F.

The bit line precharge circuit 410 may include third to sixth transistors NM3, NM4, NM5, and NM6.

The third transistor NM3 may be connected between the power source voltage and the second node N2, may be controlled by a bit line clamping control signal BLCLAMP, and may control the precharge operation on the bit line BL0.

The fourth transistor NM4 may be connected between the first node N1 and the second node N2 and may be controlled by a bit line shut-off signal BLSHF. The fifth transistor NM5 may be connected between the first node N1 and the ground power and may be controlled by a shielding signal SHLD. The sixth transistor NM6 may be connected between the second node N2 and the sensing node SO and may be controlled by a bit line connecting control signal CLBLK.

The sensing node precharge circuit 430 may include a precharge transistor PM and a load transistor PM'.

A first end of the precharge transistor PM may be connected to the sensing node SO, a second end thereof may be connected to the load transistor PM', and the precharge transistor PM may be controlled by a bit line setup signal BLSETUP. A first end of the load transistor PM' may be connected to the power source voltage, a second end thereof may be connected to the precharge transistor PM, and the load transistor PM' may be controlled by a load signal LOAD. The sensing node precharge circuit may control a precharge operation on the sensing node SO.

Figure 5:
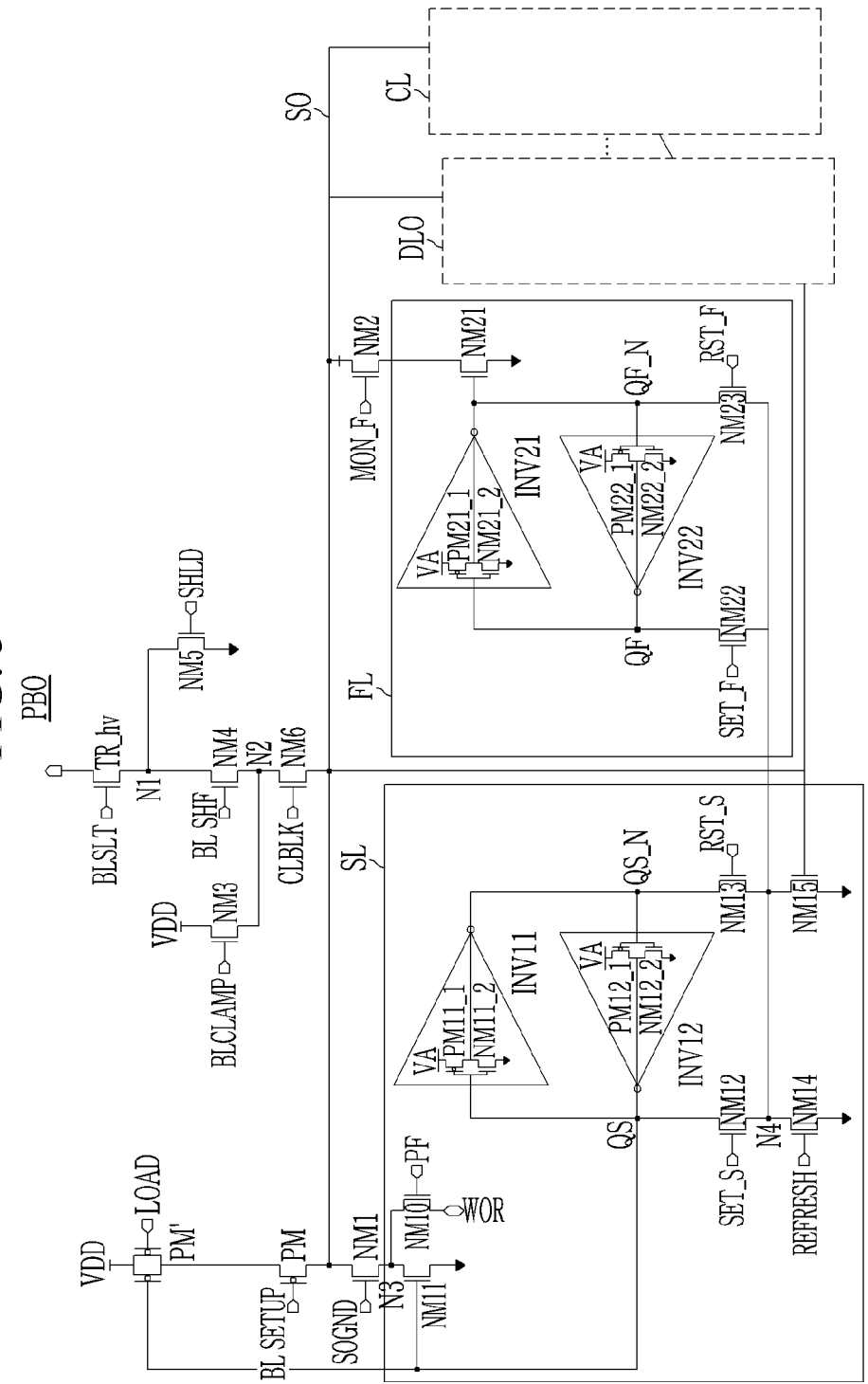
FIG. 5 shows a circuit diagram of part of a page buffer according to an embodiment.

FIG. 5 shows a circuit diagram of part of a page buffer according to an embodiment.

The sensing latch SL includes a latch circuit and transistors NM11 to NM15.

In a sensing stage, a level of a developed voltage of the sensing node SO is stored as data of a logic '0' or a logic '1' in the latch circuit of the sensing latch SL. The latch circuit may include inverters INV11 and INV12 that are cross coupled inverters connected between a set terminal QS and a reset terminal QS_N. That is, when the voltage value at the node QS of the latch circuit is the logic '1', the voltage value at the node QS_N becomes logic '0'. The eleventh inverter INV11 includes an eleventh_1 transistor PM11_1 and an eleventh_2 transistor NM11_2. The eleventh_1 transistor PM11_1 and the eleventh_2 transistor NM11_2 are coupled in series between a power terminal VA and a ground power. The twelfth inverter INV12 includes a twelfth_1 transistor PM12_1 and a twelfth_2 transistor NM12_2. The twelfth_1 transistor PM12_1 and the twelfth_2 transistor NM12_2 are coupled in series between the power terminal VA and the ground power.

A gate of the eleventh transistor NM11 may be connected to the set terminal QS. The twelfth transistor NM12 may be connected between the set terminal QS and a fourth node N4 and may be controlled by a sensing set signal SET_S. The twelfth transistor NM12 may be referred to as a sensing set transistor. The thirteenth transistor NM13 may be connected between the reset terminal QS_N and the fourth node N4, and may be controlled by a sensing reset signal RST_S. The thirteenth transistor NM13 may be referred to as a sensing reset transistor. The fourteenth transistor NM14 may be connected between the fourth node N4 and the ground power and may be controlled by a refresh signal REFRESH. The fourteenth transistor NM14 may be referred to as a refresh transistor. The fifteenth transistor NM15 may be connected between the fourth node N4 and the ground power and may be controlled by the voltage at the sensing node SO.

The forcing latch FL includes a latch circuit and transistors NM21 to NM23.

In the sensing stage, the level of the developed voltage at the sensing node SO is stored as the data of logic '0' or logic '1' in the latch circuit of the sensing latch SL. The latch circuit may include inverters INV21 and INV22 that are cross coupled inverters connected between the set terminal QF and a reset terminal QF_N. That is, when the voltage value at the node QF of the latch circuit is logic '1', the voltage value at the node QF_N becomes logic '0'. The twenty-first inverter INV21 includes a twenty-first_1 transistor PM21_1 and a twenty-first_2 transistor NM21_2. The twenty-first_1 transistor PM21_1 and the twenty-first_2 transistor NM21_2 are coupled in series between the power terminal VA and the ground power. The twenty-second inverter INV22 includes a twenty-second_1 transistor PM22_1 and a twenty-second_2 transistor NM22_2. The twenty-second_1 transistor PM22_1 and the twenty-second_2 transistor NM22_2 are coupled in series between the power terminal VA and the ground power.

The twenty-first transistor NM21 may be connected between the first end of the second transistor NM2 and the ground power and a gate of the twenty-first transistor NM21 may be connected to the reset terminal QF_N. The twenty-second transistor NM22 may be connected between the set terminal QF and the fourth node N4 and may be controlled by a forcing set signal SET_F. The twenty-second transistor NM22 may be referred to as a forcing set transistor. The twenty-third transistor NM23 may be connected between the reset terminal QF_N and the fourth node N4 and may be controlled by a forcing reset signal RST_F. The twenty-third transistor NM23 may be referred to as a forcing reset transistor.

The page buffer circuit PB0 may further include a transistor NM1' connected to a wired OR terminal WOR. In detail, the transistor NM1' may be disposed between the third node N3 and the wired OR terminal WOR, and may be controlled by a control signal PF.

Figure 6:
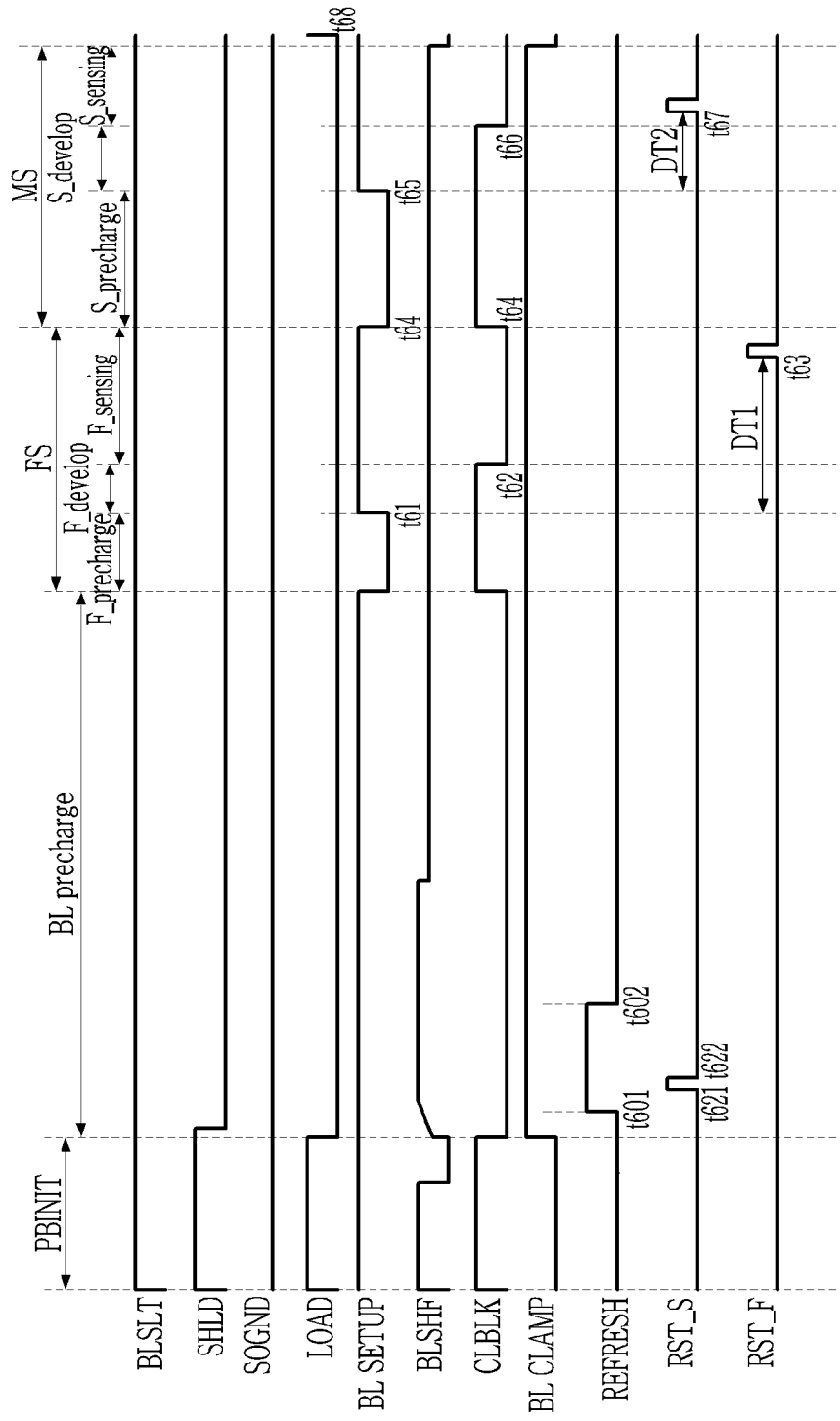
FIG. 6 shows a timing diagram of a read operation by a memory device according to an embodiment.

FIG. 6 shows a timing diagram of a read operation by a memory device.

The read operation will be described with reference to FIG. 1, FIG. 5, and FIG. 6. When the memory device 100 receives a read command from the memory controller 20, the page buffer circuit 130 performs a read operation for sensing memory cells. As shown in FIG. 6, the read operation may include a page buffer initialize period PBINIT, a bit line precharge period BL Precharge, a forcing sensing period FS, and a main sensing period MS.

The page buffer initialize period PBINIT initializes respective constituent elements of the page buffer PB0.

In detail, the bit line selection signal BLSLT, the shielding signal SHLD, the load signal LOAD, the bit line shut off signal BLSHF, and the bit line connecting signal CLBLK are transitioned to high-level in the page buffer initialize period PBINIT. Accordingly, the bit line BL0 and the sensing node SO are connected to ground so charges of the bit line BL0 and the sensing node SO may be discharged through ground.

The bit line precharge period BL Precharge charges the bit line BL with a bit line precharge voltage Vpre1.

In detail, the bit line precharge signal BLCLAMP and the bit line shut off signal BLSHF are transitioned to the high level and the shielding signal SHLD for connecting the bit line BL0 and ground is transitioned to a low level. The bit line selection signal BLSLT is high-level, following the page buffer initialize period PBINIT. Accordingly, the corresponding bit line BL0 may be charged with the bit line precharge voltage Vpre1. Here, the bit line connecting signal CLBLK is transitioned to the low level and the connection between the sensing node SO and the bit line BL0 is disconnected.

In the bit line precharge period BL Precharge, the refresh signal REFRESH is transitioned to the high level at t601 and it is transitioned to the low level at t602. The sensing reset signal RST_S may be activated to have a pulse form with a predetermined pulse width at an arbitrary time within a period in which the refresh signal REFRESH maintains the high level. The sensing reset signal RST_S is transitioned to the high level at t621 and is then transitioned to the low level at t622. While the sensing reset signal RST_S maintains the high level, the reset terminal QS_N is connected to ground so the charges stored in the reset terminal QS_N are discharged through ground.

The forcing sensing period FS may include a first precharge period F_precharge, a first develop period F_develop, and a first sensing period F_sensing.

The first precharge period F_precharge may be a time period from a time when a bit line setup BLSETUP signal is transitioned to the low level to a time when the same is transitioned to the high level.

In the first precharge period F_precharge, the bit line connecting signal CLBLK is transitioned to the high level and the bit line BL shut off signal BLSHF and the bit line selection signal BLSLT maintain the high level. Accordingly, the bit line BL0 is connected to the sensing node SO in the first precharge period F_precharge. The bit line setup signal BLSETUP is transitioned to the low level, and the load signal LOAD maintains the low level so the bit line BL0 and the sensing node SO are precharged with a sensing node precharge voltage Vpre2. The bit line precharge voltage Vpre1 may be different from the sensing node precharge voltage Vpre2, and the embodiments are not limited thereto.

The first develop period F_develop may be a time period from a time t61 when the bit line setup signal BLSETUP is transitioned to the high level to a time t62 when the bit line connecting control signal CLBLK is transitioned to the low level.

In the first develop period F_develop, the bit line setup signal BLSETUP is transitioned to the high level. As the bit line BL0 is connected to the sensing node SO, the voltages precharged to the bit line BL0 and the sensing node SO are developed according to a state of the memory cell connected to the bit line BL0.

For example, when the memory cell is an On cell, the voltages precharged to the bit line BL0 and the sensing node SO quickly fall and the charges are leaked. When the memory cell is an Off cell, the voltages precharged to the bit line BL0 and the sensing node SO may relatively weakly fall.

The first sensing period F_sensing may be defined to be a time period from an inactivated period of the bit line connecting control signal CLBLK, that is, a time t62 when the bit line connecting control signal CLBLK is transitioned to the low level to a time t64 when the same is transitioned to the high level.

In the first sensing period F_sensing, as the bit line connecting signal CLBLK is at the low level, the bit line BL0 is electrically blocked from the sensing node SO. A first developing time DT1 until the forcing reset signal RST_F is transitioned to the high level may be preset. At a time t63 when the first developing time DT1 passes from the activation time t61 of the bit line setup signal BLSETUP to the high level, the forcing reset signal RST_F may be activated in a pulse form with a predetermined pulse width so the voltage at the developed sensing node SO may be transmitted to the forcing latch FL, that is, the reset terminal QF_N.

A main sensing period MS may include a second precharge period S_precharge, a second develop period S_develop, and a second sensing period S_sensing.

The second precharge period S_precharge may be a time period from a time t64 when the bit line setup signal BLSETUP is transitioned to the low level to a time t65 when the same is transitioned to the high level.

In the second precharge period S_precharge, the bit line connecting signal CLBLK is transitioned to the high level and the bit line shut off signal BLSHF and the bit line selection signal BLSLT maintain the high level. Accordingly, the bit line BL0 is connected to the sensing node SO in the second precharge period F_precharge. As the bit line setup signal BLSETUP is transitioned to the low level and the load signal LOAD maintains the low level, the bit line BL0 and the sensing node SO are precharged with the sensing node precharge voltage Vpre2.

The second develop period S_develop may be a time period from the time t65 when the bit line setup signal BLSETUP is transitioned to the high level to a time t66 when the bit line connecting control signal CLBLK is transitioned to the low level.

In the second develop period S_develop, the bit line setup signal BLSETUP is transitioned to the high level. As the bit line BL0 is connected to the sensing node SO, the voltages precharged to the bit line BL0 and the sensing node SO are developed according to the state of the memory cell connected to the bit line BL0.

In a like way, when the memory cell is the On cell, the voltages precharged to the bit line BL0 and the sensing node SO steeply fall and the charges are leaked. When the memory cell is the Off cell, the voltages precharged to the bit line BL0 and the sensing node SO may relatively weakly fall.

The second sensing period S_sensing may be defined to be a time period from a time t66 when the bit line connecting control signal CLBLK is transitioned to the low level to a time t68 when the load signal LOAD is transitioned to the high level.

In the second sensing period S_sensing, as the bit line connecting signal CLBLK is at the low level, the bit line BL0 is electrically blocked from the sensing node SO. A second developing time DT2 until the sensing reset signal RST_S is transitioned to the high level may be preset. The sensing reset signal RST_S is activated to have a pulse shape with a predetermined pulse width at a time t67 when the second developing time DT2 passes from the activated time t65 of the bit line setup signal BLSETUP to the high level, and the voltage at the developed sensing node SO may be transmitted to the sensing latch SL, that is, the reset terminal QS_N.

The page buffer PB0 may read the data stored in the memory cell by repeating the read operation. The read operation has been described in FIG. 6 by exemplifying the page buffer PB0, which may also be applied to a plurality of page buffers PB1 to PBn-1.

In addition, the data sensed through the previous read operation before a next read operation starts after one read operation ends are latched to the sensing latch SL and the forcing latch FL in the page buffer PB0. For example, when the sensing latch SL performs a read operation to dump data to the forcing latch FL, the sensed data are latched to the sensing latch SL and the forcing latch FL, and when the forcing latch FL performs a read operation, the sensed data are latched to the forcing latch FL. Before the data sensed through a new read operation are transmitted to the sensing latch SL and the forcing latch FL, the data sensed through the previous read operation may be maintained in the inverters in the sensing latch SL and the forcing latch FL.

Referring to FIG. 5, the data read by the second precharge period S_precharge, the second develop period S_develop, and the second sensing period S_sensing in the main sensing period MS may be stored in the inverters INV11 and INV12.

For example, when the memory cell is the On cell, the charges steeply fall from the precharge voltage and a value corresponding to the logic "0" may be latched to the reset terminal QS_N, and a value corresponding to the logic "1" may be latched to the set terminal QS. In this instance, the eleventh_1 transistor PM11_1 is turned on, the eleventh_2 transistor NM11_2 is turned off, the twelfth_1 transistor PM12_1 is turned off, and the twelfth_2 transistor NM12_2 is turned on. A voltage that is greater than a threshold voltage Vth may be applied to the gate of the eleventh_1 transistor PM11_1 and it may be turned on before new data are sensed through a read operation.

The data read by the first precharge period F_precharge, the first develop period F_develop, and the first sensing period F_sensing in the forcing sensing period FS may be stored in the inverters INV21 and INV22.

For example, when the memory cell is the On cell, the value that corresponds to the logic "0" may be latched to the reset terminal QF_N and the value that corresponds to the logic "1" may be latched to the set terminal QF. Here, the twenty-first_1 transistor PM21_1 is turned on, the twenty-first_2 transistor NM21_2 is turned off, the twenty-second_1 transistor PM22_1 is turned off, and the twenty-second_2 transistor NM22_2 is turned on. A voltage that is greater than the threshold voltage Vth may be applied to the twenty-first_1 transistor PM21_1 and it may be turned on before new data are sensed.

A negative gate voltage is continuously applied to a gate of a PMOS transistor to maintain the turn-on of the PMOS transistor, and when an operation temperature is increased by driving components, an interface trap of holes may be generated in a gate oxide layer. By this, a negative bias used by a semiconductor memory device becomes unstable according to a temperature change and this phenomenon is referred to as a negative bias temperature instability (NBTI) phenomenon.

When the NBTI phenomenon is generated, formation of channels is hindered by the holes trapped on the gate oxide layer so the threshold voltage of the PMOS transistor is increased, such a threshold voltage shift becomes greater as the temperature increases, and the NBTI phenomenon may be degraded. Accordingly, reliability performance of the semiconductor memory device may be deteriorated.

Meanwhile, as a semiconductor process scaling and an operation at a higher frequency are needed, the thickness of the gate oxide layer of the transistor is gradually reduced. An influence of an electric field applied to the oxide layer increases, and a generation frequency of interface traps increases on the thin gate oxide layer. By this, the PMOS transistor is further influenced by the NBTI phenomenon and a shift of the threshold voltage Vth of the PMOS transistor may be increased more than expected.

Therefore, the threshold voltage Vth may be shifted according to the NBTI phenomenon on the eleventh_1 transistor PM11_1 and twenty-first_1 transistor PM21_1.

In a like way, for example, when the memory cell is the Off cell, the logic value "1" generated when the charges weakly fall from the precharge voltage is latched to the reset terminal QS_N and the reset terminal QF_N and the logic value "0" is latched to the set terminal QS and the set terminal QF. Here, the eleventh_1 transistor PM11_1 is turned off, the eleventh_2 transistor NM11_2 is turned on, the twelfth_1 transistor PM12_1 is turned on, and the twelfth_2 transistor NM12_2 is turned off. The twenty-first_1 transistor PM21_1 is turned off, the twenty-first_2 transistor NM21_2 is turned on, the twenty-second_1 transistor PM22_1 is turned on, and the twenty-second_2 transistor NM22_2 is turned off.

Therefore, the threshold voltage Vth may be shifted because of the NBTI phenomenon on the twelfth_1 transistor PM12_1 and the twenty-second_1 transistor PM22_1.

Figure 7:
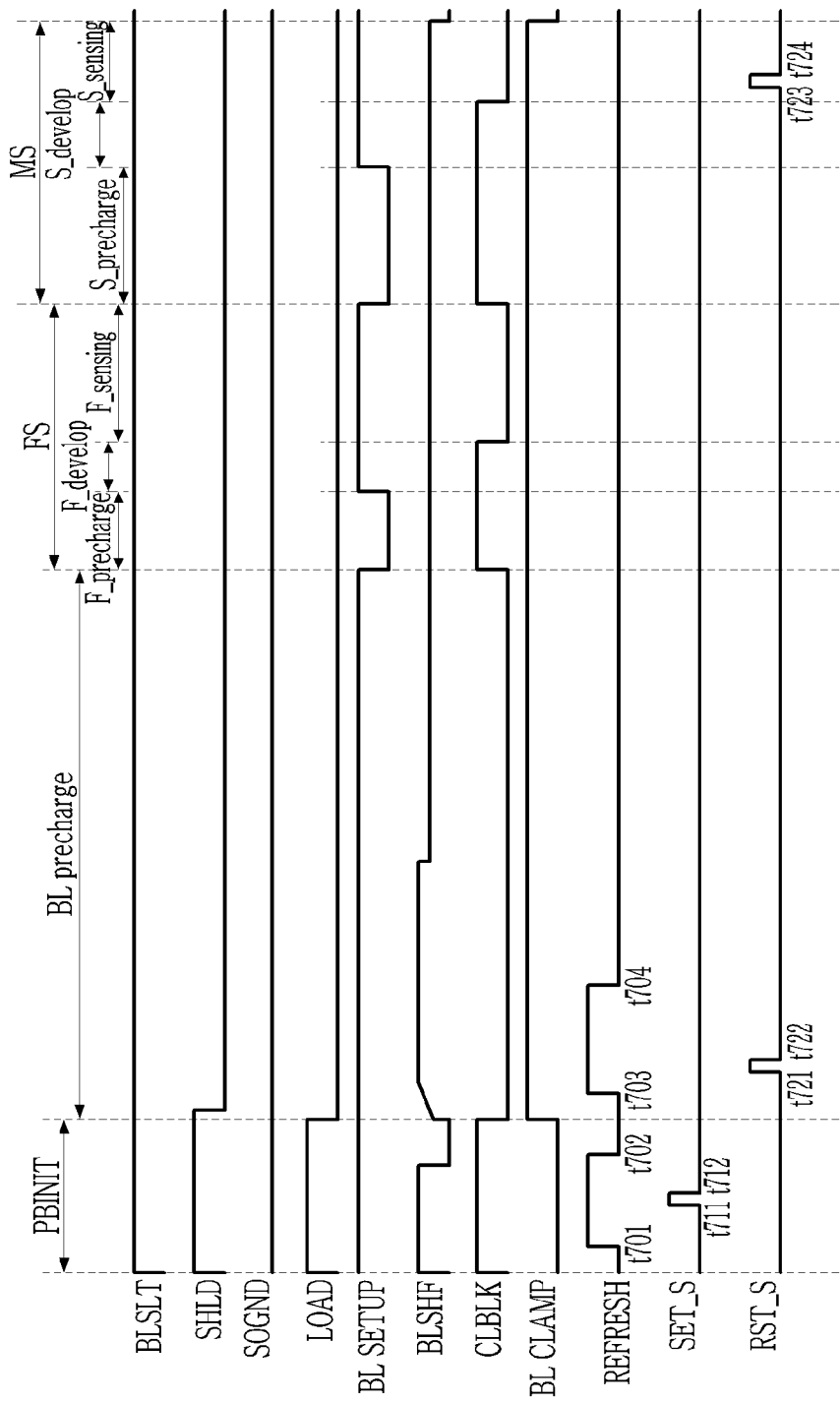
FIG. 7 shows a timing diagram of an initialization signal according to an embodiment.

FIG. 7 shows a timing diagram of a read operation by a memory device according to an embodiment of the present disclosure.

According to an embodiment, a plurality of page buffers PB0 to PBn-1 may reset the sensing latch SL in response to the initialization signal INIT to remove the charge trapped to the sensing latch SL for the page buffer initialize period PBINIT and the bit line precharge period BL Precharge. In detail, the page buffer PB0 may remove the charge trapped in the sensing latch SL according to the sensing latch control signals SET_S and RST_S and the refresh signal REFRESH.

In detail, FIG. 7 shows a timing diagram of discharging charges of the set terminal QS of the sensing latch SL in the page buffer initialize period PBINIT and discharging charges of the reset terminal QS_N in the bit line precharge period.

The refresh signal REFRESH is transitioned to the high level at t701 and is transitioned to the low level at t702. The sensing set signal SET_S is transitioned to the high level at t711 and is transitioned to the low level at t712. For the period in which the refresh signal REFRESH and the sensing set signal SET_S are the high level, the set terminal QS may be connected to ground and the charges of the set terminal QS may be discharged through ground.

FIG. 7 shows that the sensing set signal SET_S is activated to have a pulse shape with a predetermined pulse width at t711, and the embodiments are not limited thereto. The sensing set signal SET_S may be activated in a pulse shape at an arbitrary time in the period in which the refresh signal REFRESH is activated.

The refresh signal REFRESH signal is transitioned to the high level at t703 and is transitioned to the low level at t704. The sensing reset signal RST_S is transitioned to the high level at t721 and is transitioned to the low level at t722. The reset terminal QS_N may be connected to ground, and the charges stored in the reset terminal QS_N may be discharged through ground.

The sensing reset signal RST_S is shown to be activated in a pulse shape with a predetermined pulse width at t721, and the embodiments are not limited thereto. The sensing reset signal RST_S may be turned on in a pulse shape at an arbitrary period in which the refresh signal REFRESH is activated.

The page buffer PB0 may remove the charges trapped in the sensing latch SL by sequentially discharging the charges of the set terminal QS and the reset terminal QS_N in the sensing latch SL in response to the initialization signal INIT. However, the present disclosure is not limited thereto and the charges of the reset terminal QS_N and the set terminal QS may be sequentially discharged. Therefore, the threshold voltage shifted by the NBTI phenomenon may be restored in the sensing latch SL.

In detail, this will now be described with reference to FIG. 5. It will be assumed that a data value (the memory cell is the On cell) that corresponds to the logic "0" is latched to the reset terminal QS_N. A voltage that corresponds to the logic "1" is applied to the gate of the eleventh_1 transistor PM11_1, and a voltage that corresponds to the logic "0" is applied to the gate of the twelfth_1 transistor PM12_1. When the set terminal QS is connected to ground, that is, when the sensing set signal SET_S and the refresh signal REFRESH are activated, the voltage at the reset terminal QS_N is changed to the value that corresponds to the logic "1". A voltage that corresponds to the logic "0" is applied to the gate of the eleventh_1 transistor PM11_1, and a voltage that corresponds to the logic "1" is applied to the gate of the twelfth_1 transistor PM12_1. Therefore, voltages that are opposite the voltages that were previously applied are applied to the gates of the eleventh_1 transistor PM11_1 and the twelfth_1 transistor PM12_1 that are PMOS transistors, and the holes trapped in the respective gates are restored to the channel, thereby compensating the degradation according to the NBTI.

It will be assumed that a data value (the memory cell is the Off cell) that corresponds to the logic "1" is latched to the reset terminal QS_N. A voltage that corresponds to the logic "0" is applied to the gate of the eleventh_1 transistor PM11_1, and a voltage that corresponds to the logic "1" is applied to the gate of the twelfth_1 transistor PM12_1. Hence, when the set terminal QS is connected to ground, the voltages applied to the gate of the eleventh_1 transistor PM11_1 and the gate of the twelfth_1 transistor PM12_1 are not changed. However, when the reset terminal QS_N is connected to ground, that is, when the sensing reset signal RST_S and the refresh signal REFRESH are activated, the voltage at the set terminal QS is changed to the voltage that corresponds to the logic "1". That is, the voltage that corresponds to the logic "1" is applied to the gate of the eleventh_1 transistor PM11_1 and the voltage that corresponds to the logic "0" is applied to the gate of the twelfth_1 transistor PM12_1. Therefore, the voltages that are opposite the voltages that were previously applied are applied to the gates of the eleventh_1 transistor PM11_1 and the twelfth_1 transistor PM12_1 that are PMOS transistors and the holes trapped to the respective gates are restored to the channel, thereby compensating the degradation according to the NBTI.

To sum up, regardless of the value of the data latched to the sensing latch SL, the set terminal QS and the reset terminal QS_N are sequentially connected to ground to thus sequentially apply the voltage that corresponds to the logic "1" to the reset terminal QS_N and the set terminal QS so the voltage that is opposite the voltage that was latched may be applied to the gates of the eleventh_1 transistor PM11_1 and the twelfth_1 transistor PM12_1 in the inverters INV11 and INV12. Therefore, the holes trapped to the oxide layers of the gates of the eleventh_1 transistor PM11_1 and the twelfth_1 transistor PM12_1 may be removed.

At t723, the sensing reset signal RST_S is activated in a pulse shape (between times t723 and t724) so the data sensed through the precharge S-Precharge and develop S-develop operation may be stored in the initialized sensing latch SL. Resultantly, the page buffer PB0 may further accurately read data from the memory cell. It has been described in the above that the sensing set signal SET_S and the sensing reset signal RST_S are activated once within the period in which the refresh signal REFRESH is activated, to which the present disclosure is not limited, and the sensing set signal SET_S and the sensing reset signal RST_S may be activated multiple times within the period in which the refresh signal REFRESH is activated. That is, the control circuit 150 may control the sensing set transistor NM12 and the sensing reset transistor NM13 to be operated at least once within the period in which the refresh signal REFRESH is activated.

Figure 8:
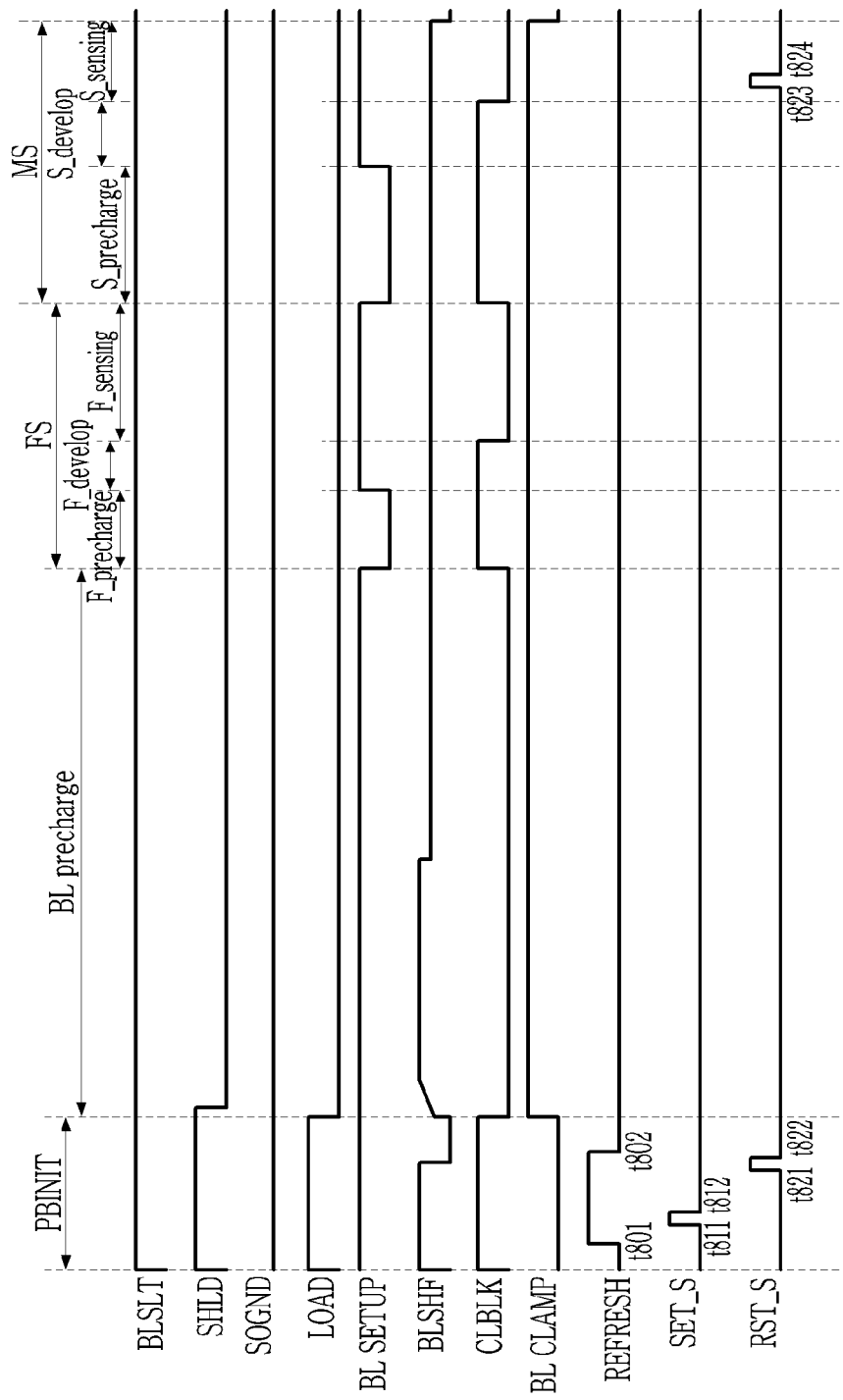
FIG. 8 shows a timing diagram of an initialization signal according to another embodiment.

FIG. 8 shows a timing diagram of a read operation by a memory device according to an embodiment of the present disclosure.

In detail, FIG. 8 shows a timing diagram of signal waveforms when the charges of the set terminal QS and the reset terminal QS_N of the sensing latch SL are discharged in the page buffer initialize period PBINIT.

The refresh signal REFRESH is transitioned to the high level at t801 and is transitioned to the low level at t802. The sensing set signal SET_S is transitioned to the high level at t811 and is transitioned to the low level at t812. In the period in which the refresh signal REFRESH and the sensing set signal SET_S are the high level, the set terminal QS may be connected to ground and the charges of the set terminal QS may be discharged through ground. The sensing reset signal RST_S is transitioned to the high level at t821 and is transitioned to the low level at t822. In the period in which the refresh signal REFRESH and the sensing reset signal RST_S are the high level, the reset terminal QS_N may be connected to ground and the charges stored in the reset terminal QS_N may be discharged through ground.

FIG. 8 shows that the sensing set signal SET_S is activated in a pulse shape with a predetermined pulse width at t811, and embodiments are not limited thereto. The sensing set signal SET_S may be activated in a pulse shape at an arbitrary time in the period in which the refresh signal REFRESH is activated. The sensing reset signal RST_S is shown to be activated in a pulse shape with a predetermined pulse width at t821, and embodiments are not limited thereto. It may be activated in a pulse shape at an arbitrary time after the sensing set signal SET_S is inactivated from among arbitrary times within the period in which the refresh signal REFRESH is activated.

The page buffer PB0 may remove the charges trapped in the sensing latch SL by discharging the set terminal QS and the reset terminal QS_N in the sensing latch SL in response to the initialization signal INIT. Therefore, the holes trapped to the oxide layers of the gates of the eleventh_1 transistor PM11_1 and the twelfth_1 transistor PM12_1 may be restored to the channel, thereby compensating the degradation according to the NBTI. This will refer to the descriptions provided with reference to FIG. 5 and FIG. 7.

At t823, the sensing reset signal RST_S may be activated in a pulse shape (between times t823 and t824), and the data sensed through the precharge S-precharge and develop S-develop operation may be stored in the initialized sensing latch SL.

Figure 9:
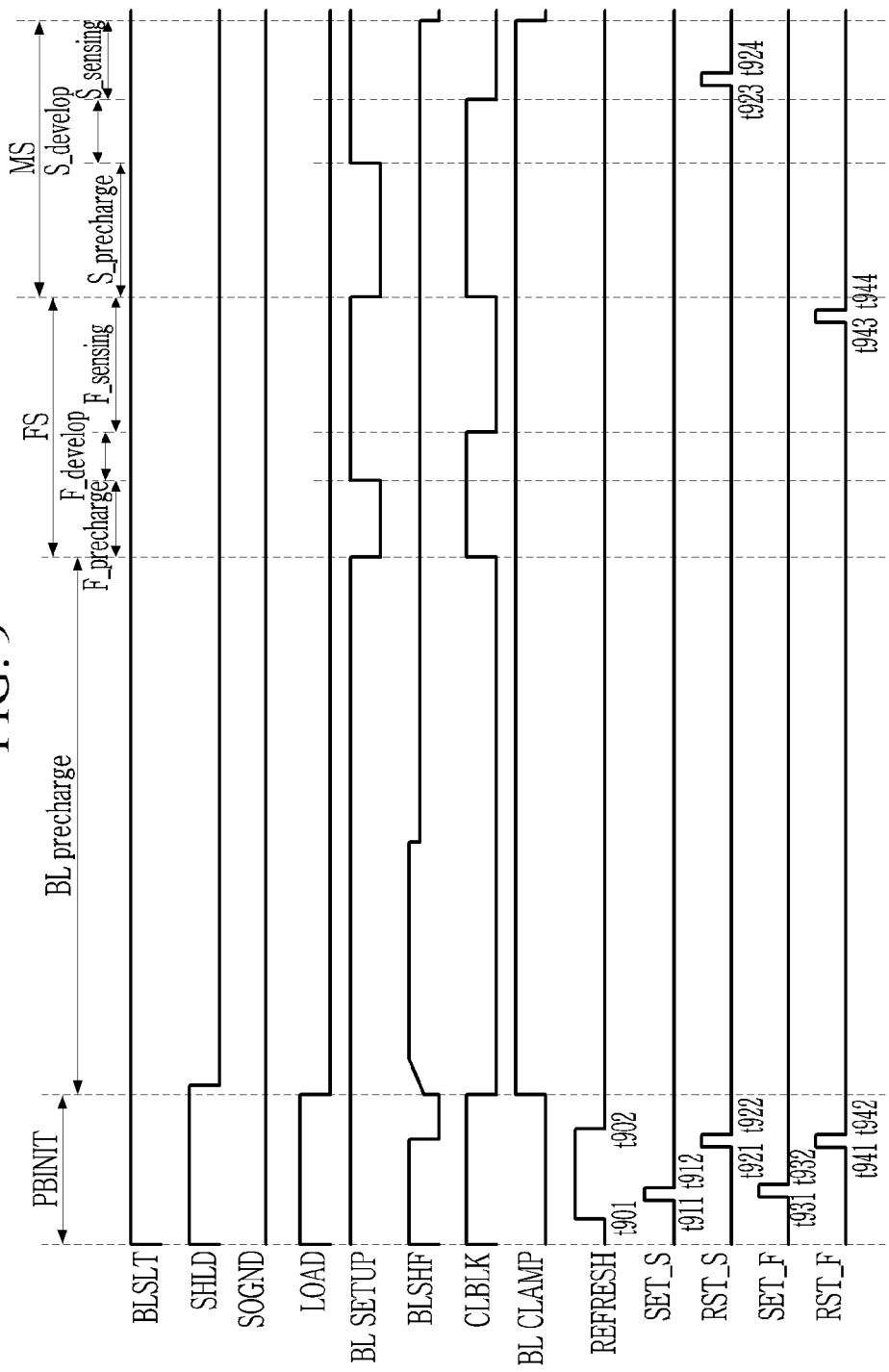
FIG. 9 shows a timing diagram of an initialization signal according to another embodiment.

FIG. 9 shows a timing diagram of a read operation by a memory device according to an embodiment of the present disclosure. According to another embodiment, a plurality of page buffers PB0 to PBn-1 may reset the sensing latch SL and the forcing latch FL in response to the initialization signal INIT to remove charges trapped to the forcing latch FL in addition to the sensing latch SL for the page buffer initialize period PBINIT and the bit line precharge period BL Precharge. In detail, the page buffer PB0 may remove the charges trapped in the sensing latch SL and the forcing latch FL according to the sensing latch control signals SET_S and RST_S, the forcing latch control signals SET_F and RST_F, and the refresh signal REFRESH.

In detail, FIG. 9 shows a timing diagram of signal waveforms when charges of a node of a sensing latch SL and a forcing latch FL are discharged in a page buffer initialize period PBINIT.

The refresh signal REFRESH is transitioned to the high level at t901 and is transitioned to the low level at t902. The sensing set signal SET_S is transitioned to the high level at t911 and is transitioned to the low level at t912. In the period in which the refresh signal REFRESH and the sensing set signal SET_S are the high level, the set terminal QS may be connected to ground and the charges of the set terminal QS may be discharged through ground. The sensing reset signal RST_S is transitioned to the high level at t921 and is transitioned to the low level at t922. In the period in which the refresh signal REFRESH and the sensing reset signal RST_S are the high level, the reset terminal QS_N may be connected to ground and the charges of the reset terminal QS_N may be discharged through ground. Therefore, the holes trapped to the oxide layers of the gates of the eleventh_1 transistor PM11_1 and the twelfth_1 transistor PM12_1 may be restored to the channel, thereby compensating the degradation according to the NBTI. This will refer to the descriptions provided with reference to FIG. 5 and FIG. 7.

The forcing set signal SET_F is transitioned to the high level at t931 and is transitioned to the low level at t932. In the period in which the refresh signal REFRESH and the forcing set signal SET_F are the high level, the set terminal QF may be connected to ground and the charges of the set terminal QF may be discharged through ground. The forcing reset signal RST_F is transitioned to the high level at t941 and is transitioned to the low level at t942. In the period in which the refresh signal REFRESH and the forcing reset signal RST_F are the high level, the reset terminal QF_N is connected to ground and the charges of the reset terminal QF_N are discharged through ground.

In detail, this will now be described with reference to FIG. 5. it will be assumed that a data value (memory cell is the On cell) that corresponds to the logic "0" is latched to the reset terminal QF_N. In this instance, the voltage that corresponds to the logic "1" is applied to the gate of the twenty-first_1 transistor PM21_1 and the voltage that corresponds to the logic "0" is applied to the gate of the twenty-second_1 transistor PM22_1. When the set terminal QF is connected to ground, that is, when the forcing set signal SET_F and the refresh signal REFRESH are activated, the voltage at a reset terminal QS_F is changed to the voltage that corresponds to the logic "1". The voltage that corresponds to the logic "0" is applied to the gate of the twenty-first_1 transistor PM21_1, and the voltage that corresponds to the logic "1" is applied to the gate of the twenty-second_1 transistor PM22_1. Therefore, the voltages that are opposite the voltages that were previously applied are applied to the gates of the twenty-first_1 transistor PM21_1 and the twenty-second_1 transistor PM22_1 that are PMOS transistors and the holes trapped to the respective gates are restored to the channel, thereby compensating the degradation according to the NBTI.

It will be assumed that the data value (the memory cell is the Off cell) that corresponds to the logic "1" is latched to the reset terminal QS_F. The voltage that corresponds to the logic "0" is applied to the gate of the twenty-first_1 transistor PM21_1, and the voltage that corresponds to the logic "1" is applied to the gate of the twenty-second_1 transistor PM22_1. Hence, when the set terminal QF is connected to ground, the voltages applied to the gates of the twenty-first_1 transistor PM21_1 and the twenty-second_1 transistor PM22_1 are not changed. However, when the reset terminal QF_N is connected to ground, that is, when the forcing reset signal RST_F and the refresh signal REFRESH are activated, the voltage at the set terminal QF is changed to the voltage that corresponds to the logic "1". The voltage that corresponds to the logic "1" is applied to the gate of the twenty-first_1 transistor PM21_1, and the voltage that corresponds to the logic "0" is applied to the gate of the twenty-second_1 transistor PM22_1. Therefore, the voltages that are opposite the voltages that were previously applied are applied to the gates of the twenty-first_1 transistor PM21_1 and the twenty-second_1 transistor PM22_1 that are PMOS transistors and the holes trapped to the respective gates are restored to the channel, thereby compensating the degradation according to the NBTI.

To summarize, in a like way of the sensing latch SL, regardless of the value of the data latched to the forcing latch FL, the set terminal QF and the reset terminal QF_N are sequentially connected to ground to apply the voltage that corresponds to the logic "1" to the reset terminal QF_N and the set terminal QF so the voltage that is opposite the voltage that was latched may be applied to the gates of the twenty-first_1 transistor PM21_1 and the twenty-second_1 transistor PM22_1 in the inverters INV21 and INV22. Therefore, the holes trapped to the oxide layers of the gates of the twelfth_1 transistor PM21_1 and the twenty-second_1 transistor PM22_1 may be removed. FIG. 9 shows that the sensing set signal SET_S is activated in a pulse shape at t911 and the forcing set signal SET_F is activated in a pulse shape at t931, and embodiments are not limited thereto. The sensing set signal SET_S and the forcing set signal SET_F may be turned on at an arbitrary time within the period in which the refresh signal REFRESH is turned on.

The sensing reset signal RST_S may be activated after the sensing set signal SET_S is inactivated from among arbitrary times within the period in which the refresh signal REFRESH is activated. In a like way, the forcing reset signal RST_F may be activated after the forcing set signal SET_F is inactivated from among arbitrary times within the period in which the refresh signal REFRESH is activated. It has been described in the above that the sensing set signal SET_S, the sensing reset signal RST_S, the forcing set signal SET_F, and the forcing reset signal RST_F are activated once within the period in which the refresh signal REFRESH is activated, to which the present disclosure is not limited, and the sensing set signal SET_S, the sensing reset signal RST_S, the forcing set signal SET_F, and the forcing reset signal RST_F may be activated multiple times within the period in which the refresh signal REFRESH is activated. That is, the control circuit 150 may control the sensing set transistor NM12, the sensing reset transistor NM13, the forcing set transistor NM22, and the forcing reset transistor NM23 to be operated at least once within the period in which the refresh signal REFRESH is activated.

The page buffer PB0 may discharge the respective nodes by connecting the set terminal QS and the reset terminal QS_N in the sensing latch SL to ground and may discharge the respective nodes by connecting the set terminal QF and the node QG_N in the forcing latch FL to ground in response to the initialization signal INIT. Therefore, the threshold voltage shifted by the NBTI phenomenon may be restored in the sensing latch SL and the forcing latch FL.

At t943, the forcing reset signal RST_F is activated in a pulse shape (between times t943 and t944), and the data sensed through the precharge F-precharge and develop F-develop operation may be stored in the initialized forcing latch FL. At t923, the sensing reset signal RST_S is activated in a pulse shape (between times t923 and t924), and the data sensed through the precharge S-precharge and develop S-develop operation may be stored in the initialized sensing latch SL.

Figure 10:
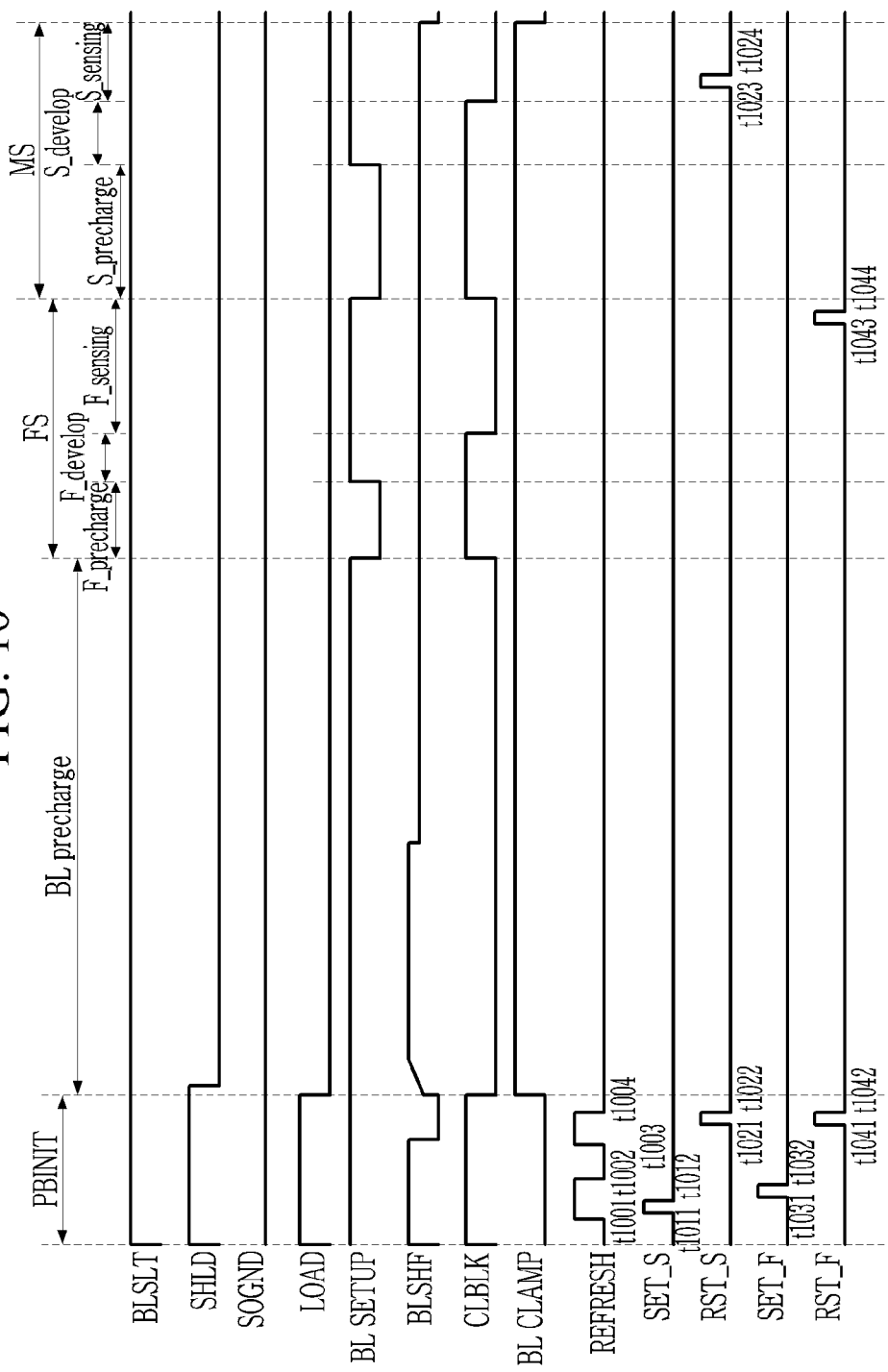
FIG. 10 shows a timing diagram of an initialization signal according to another embodiment.

FIG. 10 shows a timing diagram of a read operation by a memory device according to an embodiment of the present disclosure. In detail, FIG. 10 shows a timing diagram of signal waveforms when the charges of the node of the sensing latch SL and the forcing latch FL are discharged in the page buffer initialize period PBINIT.

The refresh signal REFRESH is transitioned to the high level at t1001 and is transitioned to the low level at t1002. The sensing set signal SET_S is transitioned to the high level at t1011 and is transitioned to the low level at t1012. In the period in which the refresh signal REFRESH and the sensing set signal SET_S are at the high level, the set terminal QS may be connected to ground and the charges of the set terminal QS may be discharged through ground. The forcing set signal SET_F is transitioned to the high level at t1031 and is transitioned to the low level at t1032. In the period in which the refresh signal REFRESH and the forcing set signal SET_F are the high level, the set terminal QF may be connected to ground and the charges of the set terminal QF may be discharged through ground.

FIG. 10 shows that the sensing set signal SET_S is activated in a pulse shape at t1011 and the forcing set signal SET_F is activated in a pulse shape at t1031, and embodiments are not limited thereto. The sensing set signal SET_S may be activated at an arbitrary time within the period in which the refresh signal REFRESH is activated. In a like way, the forcing set signal SET_F may be activated at an arbitrary time within the period in which the refresh signal REFRESH is activated.

The refresh signal REFRESH is transitioned to the high level at t1003 and is transitioned to the low level at t1004. The sensing reset signal RST_S is transitioned to the high level at t1021 and is transitioned to the low level at t1022. In the period in which the refresh signal REFRESH and the sensing reset signal RST_S are the high level, the reset terminal QS_N is connected to ground and the charges stored in the reset terminal QS_N may be discharged through ground. The forcing reset signal RST_F is transitioned to the high level at t1041 and is transitioned to the low level at t1042. In the period in which the refresh signal REFRESH and the forcing reset signal RST_F are the high level, the reset terminal QF_N may be connected to ground and the charges of the reset terminal QF_N may be discharged through ground.

Therefore, the holes trapped in the oxide layer of the gates of the eleventh_1 transistor PM11_1, the twelfth_1 transistor PM12_1, the twenty-first_1 transistor PM21_1, and the twenty-second_1 transistor PM22_1 may be restored to the channel, thereby compensating the degradation according to the NBTI. This will refer to the descriptions provided with reference to FIG. 7 and FIG. 9.

FIG. 10 shows that the sensing reset signal RST_S is activated in a pulse shape at t1021 and the forcing reset signal RST_F may be activated in a pulse shape at t1041, and embodiments are not limited thereto. The sensing reset signal RST_S may be activated at an arbitrary time within the period in which the refresh signal REFRESH is activated. In a like way, the forcing reset signal RST_F may be activated at an arbitrary time within the period in which the refresh signal REFRESH is activated.

At t1043, the forcing reset signal RST_F is activated in a pulse shape (between times t1043 and t1044), and the data sensed through the precharge F-precharge and develop F-develop operation may be stored in the initialized forcing latch FL. At t1023, the sensing reset signal RST_S is activated in a pulse shape (between times t1023 and t1024), and the data sensed through the precharge S-precharge and develop S-develop operation may be stored in the initialized sensing latch SL.

Figure 11:
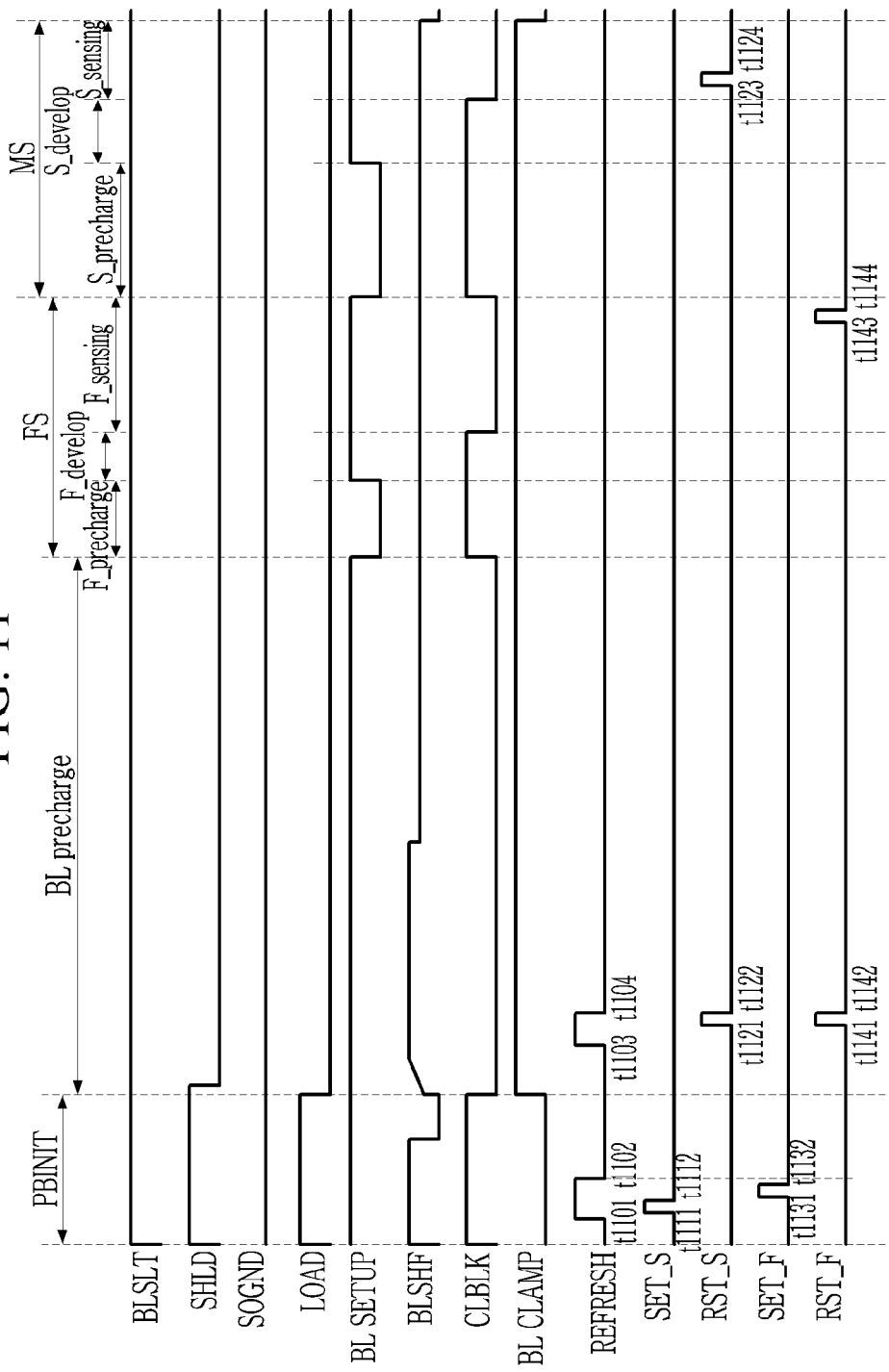
FIG. 11 shows a timing diagram of an initialization signal according to another embodiment.

FIG. 11 shows a timing diagram of a read operation by a memory device according to an embodiment of the present disclosure. In detail, FIG. 11 shows a timing diagram of signal waveforms when the charges of the node of the sensing latch SL and the forcing latch FL are discharged in the page buffer initialize period PBINIT and the bit line precharge period BL Precharge.

The refresh signal REFRESH is transitioned to the high level at t1101 and is transitioned to the low level at t1102. The sensing set signal SET_S is transitioned to the high level at t1111 and is transitioned to the low level at t1112. In the period in which the refresh signal REFRESH and the sensing set signal SET_S are the high level, the set terminal QS may be connected to ground and the charges of the set terminal QS may be discharged through ground. The forcing set signal SET_F is transitioned to the high level at t1131 and is transitioned to the low level at t1132. In the period in which the refresh signal REFRESH and the forcing set signal SET_F are the high level, the set terminal QF may be connected to ground and the charges of the set terminal QF may be discharged through ground.

Therefore, the holes trapped in the oxide layers of the gates of the eleventh_1 transistor PM11_1, the twelfth_1 transistor PM12_1, the twenty-first_1 transistor PM21_1, and the twenty-second_1 transistor PM22_1 may be restored to the channel, thereby compensating the degradation according to the NBTI. This will refer to the descriptions provided with reference to FIG. 7 and FIG. 9.

FIG. 11 shows that the sensing set signal SET_S is activated in a pulse shape at t1111 and the forcing set signal SET_F is activated in a pulse shape at t1131, and embodiments are not limited thereto. The sensing set signal SET_S and the forcing set signal SET_F may be activated at an arbitrary time within the period in which the refresh signal REFRESH is activated.

The refresh signal REFRESH is transitioned to the high level at t1103 and is transitioned to the low level at t1104. The sensing reset signal RST_S is transitioned to the high level at t1121 and is transitioned to the low level at t1122. In the period in which the refresh signal REFRESH and the sensing reset signal RST_S are the high level, the reset terminal QS_N may be connected to ground and the charges stored in the reset terminal QS_N are discharged through ground. The forcing reset signal RST_F is transitioned to the high level at t1141 and is transitioned to the low level at t1142. In the period in which the refresh signal REFRESH and the forcing reset signal RST_F are the high level, the reset terminal QF_N may be connected to ground and the charges of the reset terminal QF_N may be discharged through ground.

Therefore, the holes trapped in the oxide layers of the gates of the eleventh_1 transistor PM11_1, the twelfth_1 transistor PM12_1, the twenty-first_1 transistor PM21_1, and the twenty-second_1 transistor PM22_1 may be restored to the channel, thereby compensating the degradation according to the NBTI. This will refer to the descriptions provided with reference to FIG. 7 and FIG. 9.

FIG. 11 shows that the sensing reset signal RST_S is activated in a pulse shape at t1121 and the forcing reset signal RST_F is activated in a pulse shape at t1141, and embodiments are not limited thereto. The sensing reset signal RST_S and the forcing reset signal RST_F may be turned on at an arbitrary time within the period in which the refresh signal REFRESH is activated.

The forcing reset signal RST_F is activated in a pulse shape at t1143 (between times t1143 and t1144), and the data sensed through the precharge F-precharge and develop F-develop operation may be stored in the initialized forcing latch FL. The sensing reset signal RST_S is activated in a pulse shape at t1123 (between times t1123 and t1124), and the data sensed through the precharge S-precharge and develop S-develop operation may be stored in the initialized sensing latch SL.

Figure 12:
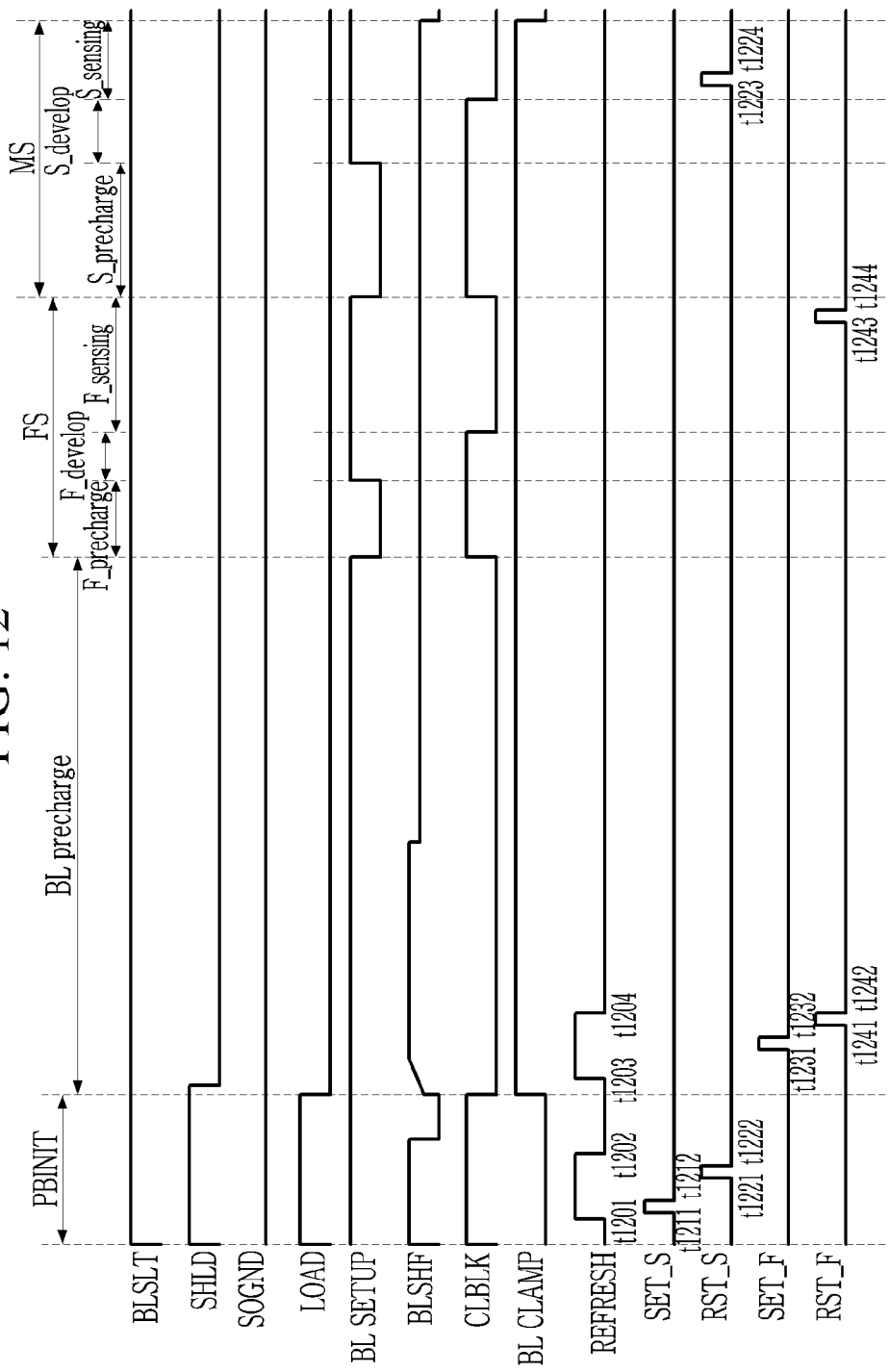
FIG. 12 shows a timing diagram of an initialization signal according to another embodiment.

FIG. 12 shows a timing diagram of a read operation by a memory device according to an embodiment of the present disclosure.

In detail, FIG. 12 shows a timing diagram of signal waveforms when the charges of the node of the sensing latch SL and the forcing latch FL are discharged in the page buffer initialize period PBINIT and the bit line precharge period BL Precharge.

The refresh signal REFRESH is transitioned to the high level at t1201 and is transitioned to the low level at t1202. The sensing set signal SET_S is transitioned to the high level at t1211 and is transitioned to the low level at t1212. In the period in which the refresh signal REFRESH and the sensing set signal SET_S are the high level, the set terminal QS may be connected to ground and the charges of the set terminal QS may be discharged through ground. The sensing reset signal RST_S is transitioned to the high level at t1221 and is transitioned to the low level at t1222. In the period in which the refresh signal REFRESH and the sensing reset signal RST_S are the high level, the reset terminal QS_N may be connected to ground and the charges stored in the reset terminal QS_N may be discharged through ground.

FIG. 12 shows that the sensing set signal SET_S is activated in a pulse shape at t1211 and the sensing reset signal RST_S is activated in a pulse shape at t1221, and embodiments are not limited thereto. The sensing set signal SET_S may be activated at an arbitrary time within the period in which the refresh signal REFRESH is activated. The sensing reset signal RST_S may be activated after the sensing set signal SET_S is inactivated from among arbitrary times within the period in which the refresh signal REFRESH is activated.

The refresh signal REFRESH is transitioned to the high level at t1203 and is transitioned to the low level at t1204. The forcing set signal SET_F is transitioned to the high level at t1231 and is transitioned to the low level at t1232. In the period in which the refresh signal REFRESH and the forcing set signal SET_F are the high level, the set terminal QF may be connected to ground and the charges of the set terminal QF may be discharged through ground. The forcing reset signal RST_F is transitioned to the high level at t1241 and is transitioned to the low level at t1242. In the period in which the refresh signal REFRESH and the forcing reset signal RST_F are the high level, the reset terminal QF_N may be connected to ground and the charges of the reset terminal QF_N may be discharged through ground.

Therefore, the holes trapped in the oxide layers of the gates of the eleventh_1 transistor PM11_1, the twelfth_1 transistor PM12_1, the twenty-first_1 transistor PM21_1, and the twenty-second_1 transistor PM22_1 may be restored to the channel, thereby compensating the degradation according to the NBTI. This will refer to the descriptions provided with reference to FIG. 7 and FIG. 9.

FIG. 12 shows that the forcing set signal SET_F is activated in a pulse shape at t1231 and the forcing reset signal RST_F is activated in a pulse shape at t1241, and embodiments are not limited thereto. The forcing set signal SET_F may be activated at an arbitrary time within the period in which the refresh signal REFRESH is activated. The forcing reset signal RST_F may be turned on after the forcing set signal SET_F is inactivated from among arbitrary times within the period in which the refresh signal REFRESH is activated.

The forcing reset signal RST_F is activated in a pulse shape at t1243 (between times t1243 and t1244), and the data sensed through the precharge F-precharge and develop F-develop operation may be stored in the initialized forcing latch FL. The sensing reset signal RST_S is activated in a pulse shape at t1223 (between times t1223 and t1224), and the data sensed through the precharge S-precharge and develop S-develop operation may be stored in the initialized sensing latch SL.

Figure 13:
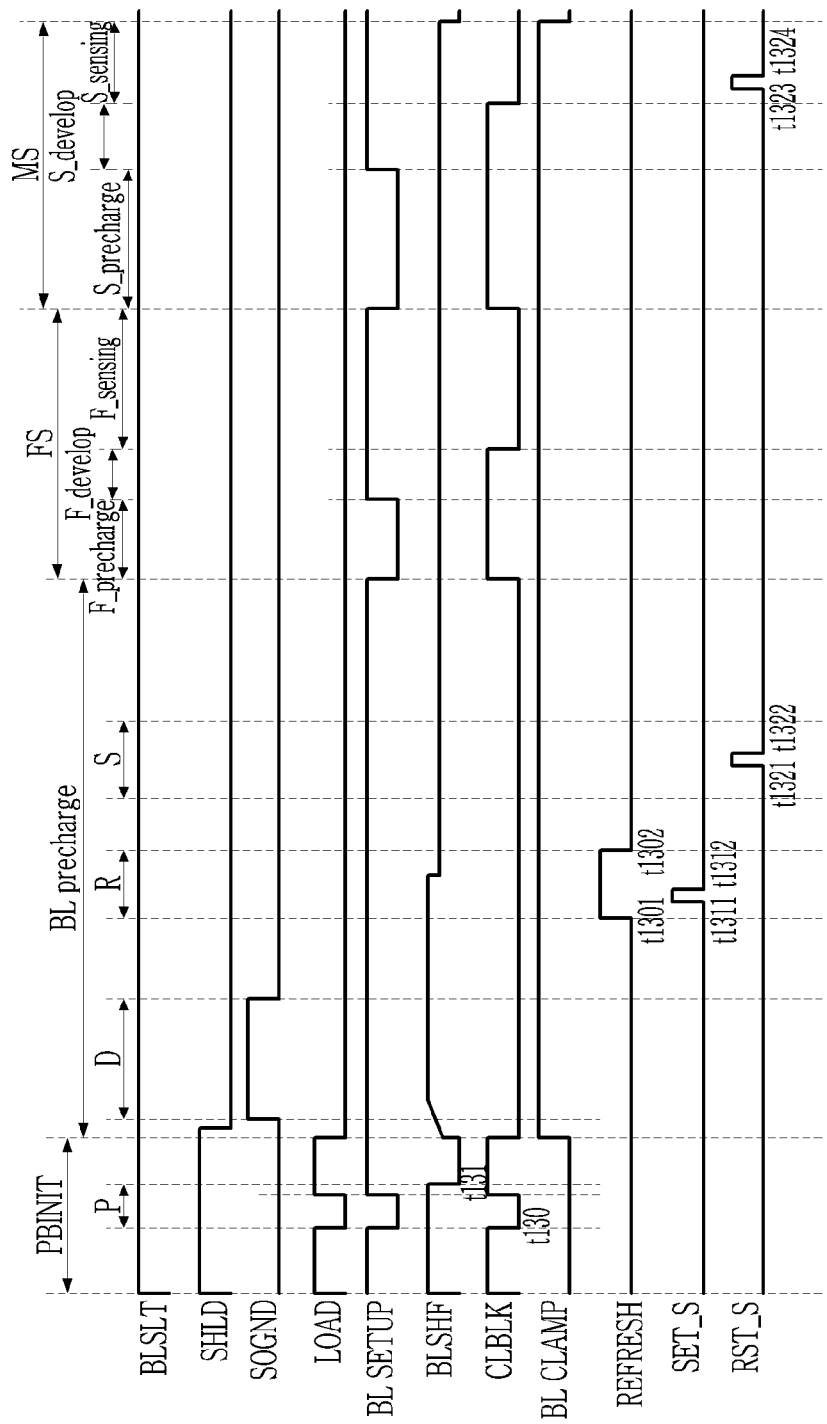
FIG. 13 shows a timing diagram of a read operation by a memory device according to another embodiment.

FIG. 13 shows a timing diagram of a read operation by a memory device according to another embodiment.

In detail, FIG. 13 shows a timing diagram of signal waveforms when the data stored in the sensing latch SL are inverted and are stored in the sensing latch SL in the page buffer initialize period PBINIT and the bit line precharge period BL Precharge. This will now be described with reference to FIG. 5.

When the memory device 100 receives a read command from the memory controller 20, the page buffer circuit 130 performs the read operation for sensing the selected memory cells. The read operation may include the page buffer initialize period PBINIT, the bit line precharge period BL Precharge, the forcing sensing period FS, and the main sensing period MS.

The read operation of the memory device 100 according to an embodiment may further include a period P in which the sensing node SO is precharged, a period D in which the sensing node is discharged, a period R in which the set terminal QS is reset, and a period S in which the value stored in the reset terminal QS_N is changed.

At t130 of the period P, the load signal LOAD, the bit line setup signal BLSETUP, and the bit line connecting signal CLBLK are transitioned to the low level. At t131, the load signal LOAD, the bit line setup signal BLSETUP, and the bit line connecting signal CLBLK are transitioned to the high level. From t130 to t131, the sensing node SO is precharged with the precharge voltage Vpre2.

In the period D, the ground control signal SOGND is transitioned to the high level. The sensing node SO is connected to the third node N3. When the value latched to the set terminal QS is the data "1", the eleventh transistor NM11 is turned on. As the sensing node SO is connected to ground, the charges of the sensing node SO are discharged to ground. The value that corresponds to the data "0" is latched to the set terminal QS.

However, when the value latched to the set terminal QS is the data "0", the eleventh transistor NM11 is turned off so the charges of the sensing node SO are maintained, and the charges latched to the set terminal QS are maintained.

In the period R, the refresh signal REFRESH is transitioned to the high level at time t1301. The sensing set signal SET_S is transitioned to the high level at time t1311 and is transitioned to the low level at time t1312. The sensing set signal SET_S is shown to be activated in a pulse shape at t1311, and embodiments are not limited thereto. The sensing set signal SET_S may be activated at an arbitrary time within the period in which the refresh signal REFRESH is activated.

In the period R in which the refresh signal REFRESH and the sensing set signal SET_S are the high level, the set terminal QS may be connected to ground and the charges of the set terminal QS may be discharged to ground. Accordingly, the voltage at the set terminal QS may be changed to the low level, the data "0" may be latched to the set terminal QS, the voltage at the reset terminal QS_N may be changed to the high level, and the data "1" may be latched to the reset terminal QS_N.

Finally, in the period S, the sensing reset signal RST_S is activated in a pulse shape between time t1321 and time t1322.

The fifteenth transistor NM15 may be turned on when the sensing node SO has the voltage (when the value latched to the reset terminal QS_N is "1") that corresponds to the high level. As the fifteenth transistor NM15 is turned on, the reset terminal QS_N is connected to ground and the charges of the reset terminal QS_N may be discharged to ground.

When the sensing node SO as the voltage (when the value latched to the reset terminal QS is "0") that corresponds to the low level, the fifteenth transistor NM15 is not turned on and the charges of the reset terminal QS_N are maintained. That is, the reset terminal QS_N may have the value that corresponds to the logic "1".

To summarize, the memory device 100 performs the read operation including the period P, the period D, the period R, and the period S to thus latch the value that is opposite the value latched to the sensing latch SL and restore the threshold voltage of the shifted latches.

In detail, the memory device 100 may operate so that the reset terminal QS_N may have the value that corresponds to the logic "1" when the value latched to the reset terminal QS_N is "0" and the reset terminal QS_N may have the value that corresponds to the logic "0" when the value latched to the reset terminal QS_N is "1". Therefore, voltages that are opposite the voltages that were previously applied are applied to the gates of the eleventh_1 transistor PM11_1 and the twelfth_1 transistor PM12_1 that are PMOS transistors and the holes trapped to the respective gates are removed, thereby compensating the degradation according to the NBTI.

FIG. 13 shows that the period P is in the page buffer initialize period PBINIT and the period D, the period R, and the period S are in the bit line precharge period BL Precharge, and embodiments are not limited thereto. For example, the bit line precharge period BL Precharge may include the period P, the period D, the period R, and the period S and the page buffer initialize period PBINIT may include the period P, the period D, the period R, and the period S.

The memory device according to an embodiment may remove the change of the threshold voltage according to the trapped charges of the latch of the page buffer at the time of the read operation. Therefore, the level of the precharge voltage of the bit line or the sensing node is not influenced according to the trapped charges of the latch, thereby providing a high sensing margin and also providing high reliability.

Figure 14:
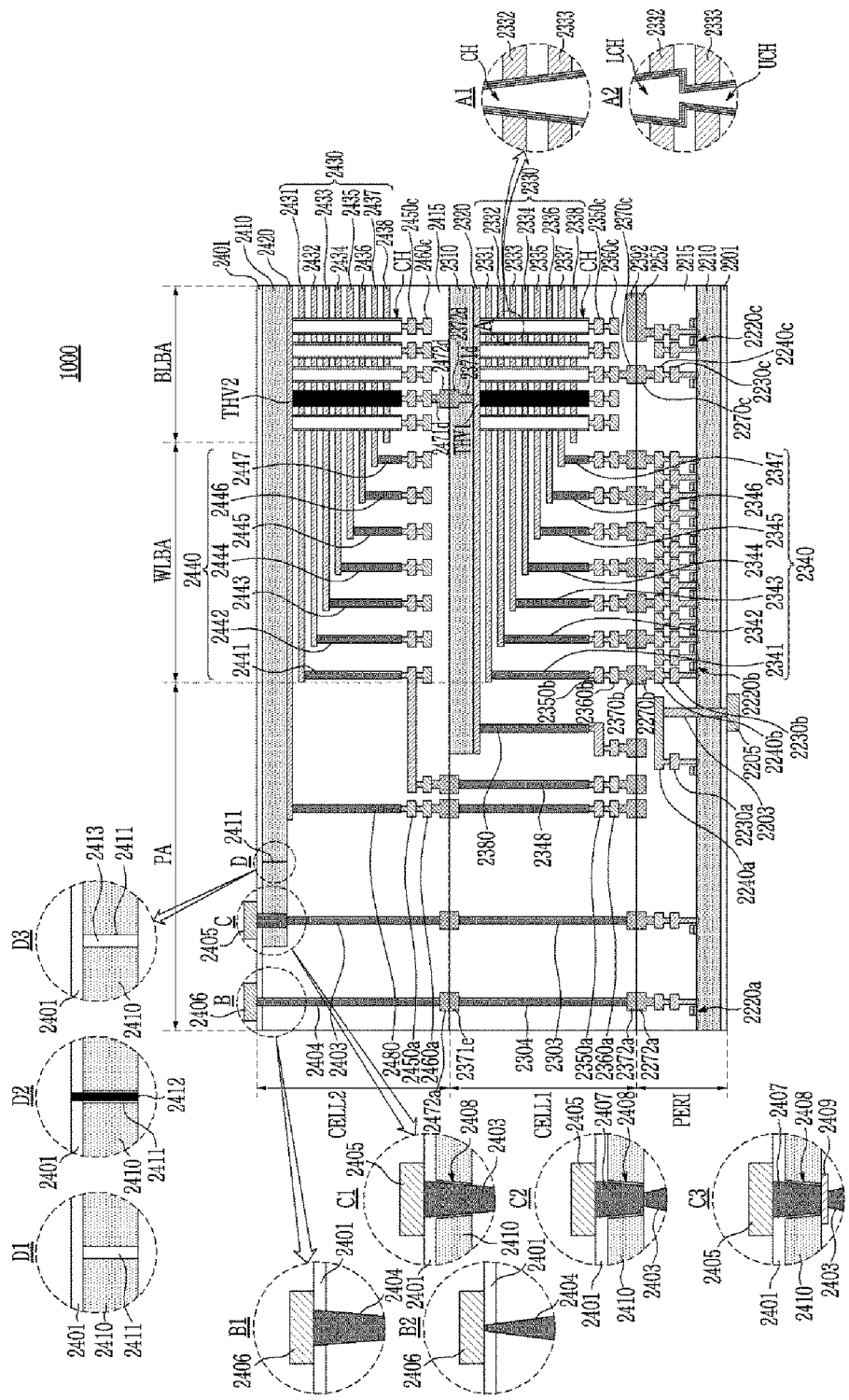
FIG. 14 shows a memory device according to an embodiment.

FIG. 14 shows a memory device according to an embodiment.

In detail, the memory device 1000 according to an embodiment may include at least one upper chip including a cell area. For example, as shown in FIG. 14, the memory device 1000 may be realized to include two upper chips. However, this is an example, and the number of the upper chips is not limited thereto. When the memory device 1000 is realized to include two upper chips, the memory device 1000 may be manufactured by manufacturing a first upper chip including a first cell area CELL1, a second upper chip including a second cell area CELL2, and a lower chip including a peripheral circuit area PERI and connecting the first upper chip, the second upper chip, and the lower chip to each other according to a bonding method. The first upper chip may be inverted and may be connected to the lower chip according to the bonding method, and the second upper chip may be inverted and may be connected to the first upper chip according to the bonding method. An upper direction and a lower direction are marked with reference to the first upper chip and the second upper chip that are not inverted. That is, the upper direction of the lower chip signifies a +Z-axis direction, and the upper direction of the first and second upper chips signify a −Z-axis direction. Without being limited thereto, this is an example, and one of the first upper chip and the second upper chip may be inverted and may be connected to each other by the bonding method.

The peripheral circuit area PERI and the first and second cell areas CELL1 and CELL2 of the memory device 1000 may respectively include an external pad bonding area PA, a word line bonding area WLBA, and a bit line bonding area BLBA.

The peripheral circuit area PERI may include a first substrate 2210 and a plurality of circuit components 2220a, 2220b, and 2220c formed on the first substrate 2210. At least one layer of an interlayer insulating layer 2215 may be provided on the circuit components 2220a, 2220b and 2220c, and a plurality of metal wires for connecting the circuit components 2220a, 2220b, and 2220c may be provided on the interlayer insulating layer 2215. For example, the metal wires may include first metal wires 2230a, 2230b, and 2230c connected to the circuit components 2220a, 2220b, and 2220c and second metal wires 2240a, 2240b, and 2240c formed on the first metal wires 2230a, 2230b, and 2230c. The metal wires may be made of various types of conductive materials. For example, the first metal wires 2230a, 2230b, and 2230c may be made of tungsten that has relatively high electrical resistivity and the second metal wires 2240a, 2240b, and 2240c may be made of copper that has relatively low electrical resistivity.

The first metal wires 2230a, 2230b, and 2230c and the second metal wires 2240a, 2240b, and 2240c are shown and described in the present specification, but the embodiment is not limited thereto and at least one metal wire may be further formed on the second metal wires 2240a, 2240b, and 2240c. In this case, the second metal wires 2240a, 2240b, and 2240c may be made of aluminum. At least some of at least one metal wire made on upper portions of the second metal wires 2240a, 2240b, and 2240c may be made of copper that has lower electrical resistivity than the aluminum of the second metal wires 2240a, 2240b, and 2240c.

The interlayer insulating layer 2215 is disposed on the first substrate 2210 and may include an insulating material such as a silicon oxide or a silicon nitride.

The first and second cell areas CELL1 and CELL2 may provide at least one memory block. The first cell area CELL1 may include a second substrate 2310 and a common source line 2320. A plurality of word lines 2331 to 2338, collectively identified as word lines 2330, may be stacked on the second substrate 2310 in a direction (Z-axis direction) that is perpendicular to an upper side of the second substrate 2310. The string select lines SSL and the ground select line GSL may be disposed on an upper portion and a lower portion of the word lines 2330, and a plurality of word lines 2330 may be disposed between the string select lines SSL and the ground select line GSL. In a like way, the second cell area CELL2 includes a third substrate 2410 and a common source line 2420, and a plurality of word lines 2431 to 2438, collectively referred to as word lines 2430, may be stacked in the direction (Z-axis direction) that is perpendicular to the upper side of the third substrate 2410. The second substrate 2310 and the third substrate 2410 may be made of various materials, and for example, it may be a substrate including a monocrystalline epitaxial layer grown on a silicon substrate, a silicon-germanium substrate, a germanium substrate, or a monocrystalline silicon substrate. A plurality of channel structures CH may be formed in the first and second cell areas CELL1 and CELL2.

In an embodiment, as shown by species A1 of genus A, the channel structure CH is provided to the bit line bonding area BLBA, may extend in the direction that is perpendicular to the upper side of the second substrate 2310, and may penetrate the word lines 2330, the string select lines, and the ground select line. The channel structure CH may include a data storage layer, a channel layer, and a fill insulation layer. The channel layer may be electrically connected to a first metal wire 2350c and a second metal wire 2360c in the bit line bonding area BLBA. For example, the second metal wire 2360c may be a bit line and may be connected to the channel structure CH through the first metal wire 2350c. The bit line 2360c may extend in a first direction (Y-axis direction) that is parallel to the upper side of the second substrate 2310.

In an embodiment, as shown by A2, the channel structure CH may include a lower channel LCH and an upper channel UCH connected to each other. For example, the channel structure CH may be formed by a process on the lower channel LCH and a process on the upper channel UCH. The lower channel LCH may extend to be perpendicular to the upper side of the second substrate 2310 and may penetrate the common source line 2320 and the lower word lines 2331 and 2332. The lower channel LCH may include a data storage layer, a channel layer, and a fill insulation layer and may be connected to the upper channel UCH. The upper channel UCH may penetrate the upper word lines 2333 to 2338. The upper channel UCH may include a data storage layer, a channel layer, and a fill insulation layer and the channel layer of the upper channel UCH may be electrically connected to the first metal wire 2350c and the second metal wire 2360c. When a length of the channel increases, it may be difficult to form the channel with a constant width because of process reasons. The memory device 1000 according to an embodiment may have the channel having uniformity of the width through the lower channel LCH and the upper channel UCH formed by a sequential process.

As shown by A2, when the channel structure CH includes the lower channel LCH and the upper channel UCH, the word line positioned near a border of the lower channel LCH and the upper channel UCH may be a dummy word line. For example, the word line 2332 and the word line 2333 forming the border of the lower channel LCH and the upper channel UCH may be dummy word lines. In this case, data may not be stored in the memory cells connected to the dummy word line. In another way, the number of pages configured by the memory cells connected to the dummy word line may be less than the number of pages configured by the memory cells connected to the general word line. The voltage level applied to the dummy word line may be different from the voltage level applied to the general word line, and hence, the influence to the operation of the memory device by the non-uniform channel width between the lower channel LCH and the upper channel UCH may be reduced.

Referring to A2, the number of the lower word lines 2331 and 2332 penetrated by the lower channel LCH is shown to be less than the number of the upper word lines 2333 to 2338 penetrated by the upper channel UCH. However, this is an example, and the present disclosure is not limited hereto. For another example, the number of the lower word lines penetrating the lower channel LCH may be equal to or greater than the number of the upper word lines penetrated by the upper channel UCH. The structure and the connection of the channel structure CH disposed in the first cell area CELL1 may be identically applied to the channel structure CH disposed in the second cell area CELL2.

A first penetration electrode THV1 may be provided to the first cell area CELL1, and a second penetration electrode THV2 may be provided to the second cell area CELL2 in the bit line bonding area BLBA. As shown in FIG. 14, the first penetration electrode THV1 may penetrate the common source line 2320 and the word lines 2330. However, this is an example, and the first penetration electrode THV1 may penetrate the second substrate 2310. The first penetration electrode THV1 may include a conductive material. In another way, the first penetration electrode THV1 may include a conductive material surrounded by the insulating material. The second penetration electrode THV2 may be provided with the same form and structure as the first penetration electrode THV1.

In an embodiment, the first penetration electrode THV1 may be electrically connected to the second penetration electrode THV2 through the first penetration metal pattern 2372d and the second penetration metal pattern 2472d. The first penetration metal pattern 2372d may be formed on a lower end of the first upper chip including the first cell area CELL1, and the second penetration metal pattern 2472d may be formed on an upper end of the second upper chip including the second cell area CELL2. The first penetration electrode THV1 may be electrically connected to the first metal wire 2350c and the second metal wire 2360c. The second penetration electrode THV2 may be electrically connected to the first metal wire 2450c and the second metal wire 2460c. A lower via 2371d may be formed between the first penetration electrode THV1 and the first penetration metal pattern 2372d, and an upper via 2471d may be formed between the second penetration electrode THV2 and the second penetration metal pattern 2472d. The first penetration metal pattern 2372d may be connected to the second penetration metal pattern 2472d by a bonding method.

In the bit line bonding area BLBA, an upper metal pattern 2252 may be formed on an uppermost metal layer of the peripheral circuit area PERI and an upper metal pattern 2392 with the same shape as the upper metal pattern 2252 may be formed on an uppermost metal layer of the first cell area CELL1. The upper metal pattern 2392 of the first cell area CELL1 may be electrically connected to the upper metal pattern 2252 of the peripheral circuit area PERI by a bonding method. The bit line 2360c may be electrically connected to the page buffer included in the peripheral circuit area PERI in the bit line bonding area BLBA. For example, some of the circuit components 2220c of the peripheral circuit area PERI may provide a page buffer and the bit line 2360c may be electrically connected to the circuit components 2220c providing the page buffer through the upper bonding metal 2370c of the first cell area CELL1 and the upper bonding metal 2270c of the peripheral circuit area PERI.

Referring to FIG. 14, in the word line bonding area WLBA, the word lines 2330 of the first cell area CELL1 may extend in the second direction (X-axis direction) that is parallel to the upper side of the second substrate 2310 and may be connected to a plurality of cell contact plugs 2341 to 2347, which are collectively referred to a cell contact plugs 2340. A first metal wire 2350b and a second metal wire 2360b may be sequentially connected to upper portions of the cell contact plugs 2340 connected to the word lines 2330. The cell contact plugs 2340 may be connected to the peripheral circuit area PERI through an upper bonding metal 2370b of the first cell area CELL1 and an upper bonding metal 2270b of the peripheral circuit area PERI in the word line bonding area WLBA.

The cell contact plugs 2340 may be electrically connected to the row decoder included in the peripheral circuit area PERI. For example, some of the circuit components 2220b of the peripheral circuit area PERI provide the row decoder and the cell contact plugs 2340 may be electrically connected to the circuit components 2220b for providing row decoders through the upper bonding metal 2370b of the first cell area CELL1 and the upper bonding metal 2270b of the peripheral circuit area PERI. In an embodiment, the operating voltage of the circuit components 2220b providing row decoders may be different from the operating voltage of the circuit components 2220c providing the page buffer. For example, the operating voltage of the circuit components 2220c providing the page buffer may be greater than the operating voltage of the circuit components 2220b providing the row decoder.

In a like way, in the word line bonding area WLBA, the word lines 2430 of the second cell area CELL2 may extend in the second direction (X-axis direction) that is parallel to the upper side of the third substrate 2410 and may be connected to a plurality of cell contact plugs 2441 to 2447, which are collectively referred to as cell contact plugs 2440. The cell contact plugs 2440 may be connected to the peripheral circuit area PERI through the upper metal pattern of the second cell area CELL2, the lower metal pattern and the upper metal pattern of the first cell area CELL1, and the cell contact plug 2348.

The upper bonding metal 2370b may be formed in the first cell area CELL1, and the upper bonding metal 2270b may be formed in the peripheral circuit area PERI in the word line bonding area WLBA. The upper bonding metal 2370b of the first cell area CELL1 may be electrically connected to the upper bonding metal 2270b of the peripheral circuit area PERI by a bonding method. The upper bonding metal 2370b and the upper bonding metal 2270b may be made of aluminum, copper, or tungsten.

A lower metal pattern 2371e may be formed on a lower portion of the first cell area CELL1, and an upper metal pattern 2472a may be formed on an upper portion of the second cell area CELL2 in the external pad bonding area PA. The lower metal pattern 2371e of the first cell area CELL1 may be connected to the upper metal pattern 2472a of the second cell area CELL2 by a bonding method in the external pad bonding area PA. In a like way, an upper metal pattern 2372a may be formed on an upper portion of the first cell area CELL1 and an upper metal pattern 2272a may be formed on an upper portion of the peripheral circuit area PERI. The upper metal pattern 2372a of the first cell area CELL1 may be connected to the upper metal pattern 2272a of the peripheral circuit area PERI by a bonding method.

Common source line contact plugs 2380 and 2480 may be disposed in the external pad bonding area PA. The common source line contact plugs 2380 and 2480 may be made of a conductive material such as a metal, a metal compound, or polysilicon. The common source line contact plug 2380 of the first cell area CELL1 may be electrically connected to the common source line 2320, and the common source line contact plug 2480 of the second cell area CELL2 may be electrically connected to the common source line 2420. A first metal wire 2350a and a second metal wire 2360a may be sequentially stacked on an upper portion of the common source line contact plug 2380 of the first cell area CELL1, and a first metal wire 2450a and a second metal wire 2460a may be sequentially stacked on an upper portion of the common source line contact plug 2480 of the second cell area CELL2.

Input and output pads 2205, 2405, and 2406 may be disposed in the external pad bonding area PA. Referring to FIG. 14, a lower insulation layer 2201 for covering a lower side of the first substrate 2210 may be formed on a lower portion of the first substrate 2210 and the first input and output pad 2205 may be formed on the lower insulation layer 2201. The first input and output pad 2205 may be connected to at least one of a plurality of circuit components 2220a disposed in the peripheral circuit area PERI through the first input and output contact plug 2203 and may be separated from the first substrate 2210 by the lower insulation layer 2201. A lateral insulation layer may be disposed between the first input and output contact plug 2203 and the first substrate 2210 and may electrically separate the first input and output contact plug 2203 and the first substrate 2210.

An upper insulation layer 2401 for covering an upper side of the third substrate 2410 may be formed on an upper portion of the third substrate 2410. The second input and output pad 2405 and/or the third input and output pad 2406 may be disposed on the upper insulation layer 2401. The second input and output pad 2405 may be connected to at least one of a plurality of circuit components 2220a disposed in the peripheral circuit area PERI through the second input and output contact plugs 2403 and 2303, and the third input and output pad 2406 may be connected to at least one of a plurality of circuit components 2220a disposed in the peripheral circuit area PERI through the third input and output contact plugs 2404 and 2304.

In an embodiment, the third substrate 2410 may not be disposed in a region in which the input and output contact plug is disposed. For example, as shown by B, the third input and output contact plug 2404 may be separated from the third substrate 2410, in a direction that is parallel to the upper side of the third substrate 2410, and may penetrate the interlayer insulating layer 2415 of the second cell area CELL2 and may be connected to the third input and output pad 2406. In this case, the third input and output contact plug 2404 may be formed with various processes.

For example, as shown by B1, the third input and output contact plug 2404 may extend in the third direction (Z-axis direction) and may be formed to increase in diameter when approaching the upper insulation layer 2401. That is, the diameter of the third input and output contact plug 2404 may increase when approaching the upper insulation layer 2401 while the diameter of the channel structure CH described with A1 is formed to be reduced when approaching the upper insulation layer 2401. For example, the third input and output contact plug 2404 may be formed after the second cell area CELL2 is combined to the first cell area CELL1 by a bonding method.

For example, as shown by B2, the third input and output contact plug 2404 may extend in the third direction (Z-axis direction) and its diameter may be formed to be reduced when approaching the upper insulation layer 2401. That is, the diameter of the third input and output contact plug 2404 may be formed to be reduced when approaching the upper insulation layer 2401 in a like way of the channel structure CH. For example, the third input and output contact plug 2404 may be formed together with the cell contact plugs 2440 before bonding the second cell area CELL2 and the first cell area CELL1.

In another embodiment, the input and output contact plug may be disposed to overlap the third substrate 2410. For example, as shown by C, the second input and output contact plug 2403 penetrates the interlayer insulating layer 2415 of the second cell area CELL2, in the third direction (Z-axis direction), and may be electrically connected to the second input and output pad 2405 through the third substrate 2410. In this case, the connection structure of the second input and output contact plug 2403 and the second input and output pad 2405 may be realized in various ways.

For example, as shown by C1, an opening 2408 penetrating the third substrate 2410 may be formed and the second input and output contact plug 2403 may be connected to the second input and output pad 2405 through the opening 2408 formed in the third substrate 2410. In this case, as shown by C1, the second input and output contact plug 2403 may be formed to have a greater diameter when approaching the second input and output pad 2405. However, this is an example, and the diameter of the second input and output contact plug 2403 may become less when approaching the second input and output pad 2405.

For example, as shown by C2, the opening 2408 penetrating the third substrate 2410 may be formed and a contact 2407 may be formed in the opening 2408. A first end portion of the contact 2407 may be connected to the second input and output pad 2405 and a second end portion thereof may be connected to the second input and output contact plug 2403. The second input and output contact plug 2403 may be electrically connected to the second input and output pad 2405 through the contact 2407 in the opening 2408. In this case, as shown by C2, the diameter of the contact 2407 may increase when approaching the second input and output pad 2405 and the diameter of the second input and output contact plug 2403 may be formed to be reduced when approaching the second input and output pad 2405. For example, the third input and output contact plug 2403 is formed together with the cell contact plugs 2440 before bonding the second cell area CELL2 and the first cell area CELL1 and the contact 2407 may be formed after bonding the second cell area CELL2 and the first cell area CELL1.

For example, as shown by C3, a stopper 2409 may be further formed on an upper side of the opening 2408 of the third substrate 2410, compared to C2. The stopper 2409 may be a metal wire formed on a same layer as the common source line 2420. However, this is an example, and the stopper 2409 may be a metal wire formed on the same layer as at least one of the word lines 2403. The second input and output contact plug 2403 may be electrically connected to the second input and output pad 2405 through the contact 2407 and the stopper 2409.

In addition, in a like way of the second and third input and output contact plugs 2403 and 2404 of the second cell area CELL2, the second and third input and output contact plugs 2303 and 2304 of the first cell area CELL1 may be formed to have the diameter that is reduced when approaching the lower metal pattern 2371e or have the diameter that is increased when approaching the lower metal pattern 2371e.

Depending on embodiments, a slit 2411 may be formed on the third substrate 2410. For example, the slit 2411 may be formed on an arbitrary position in the external pad bonding area PA. As shown by D, the slit 2411 may be positioned between the second input and output pad 2405 and the cell contact plugs 2440 in a plan view. However, this is an example, and in a plan view, the slit 2411 may be formed so that the second input and output pad 2405 may be positioned between the slit 2411 and the cell contact plugs 2440.

For example, as shown by D1, the slit 2411 may penetrate the third substrate 2410. The slit 2411 may be used to prevent the substrate 2410 from being finely cracked when the opening 2408 is formed. However, this is an example and the slit 2411 may be formed to have a depth that is about 60 to 70% of the thickness of the third substrate 2410.

For example, as shown by D2, a conducting material 2412 may be formed in the slit 2411. The conducting material 2412 may be used to discharge a leakage current generated while driving the circuit components in the external pad bonding area PA to the outside. In this case, the conducting material 2412 may be connected to an external ground line.

For example, as shown by D3, an insulating material 2413 may be formed in the slit 2411. The insulating material 2413 may electrically separate the second input and output pad 2405 and the second input and output contact plug 2403 disposed in the external pad bonding area PA from the word line bonding area WLBA. By forming the insulating material 2413 in the slit 2411, the voltage provided through the second input and output pad 2405 may be prevented from influencing the metal layer of the word line bonding area WLBA disposed on the upper side of the third substrate 2410.

Depending on embodiments, the first to third input and output pads 2205, 2405, and 2406 may be selectively formed. For example, the memory device 500 may include a first input and output pad 2205 disposed on the upper portion of the first substrate 2201, may include a second input and output pad 2405 disposed on the upper portion of the third substrate 2410, or may include a third input and output pad 2406 disposed on the upper portion of the upper insulation layer 2401.

According to embodiments, at least one of the second substrate 2310 of the first cell area CELL1 and the third substrate 2410 of the second cell area CELL2 may be used as a sacrificial substrate and it may be completely or partly removed before or after the bonding process. An additional film may be stacked after the removal of the substrate. For example, the second substrate 2310 of the first cell area CELL1 may be removed before or after bonding the peripheral circuit area PERI and the first cell area CELL1 and an insulation layer for covering the upper side of the common source line 2320 or a conductive layer for a connection may be formed. Similarly, the third substrate 2410 of the second cell area CELL2 may be removed before or after bonding the first cell area CELL1 and the second cell area CELL2 and an upper insulation layer 2401 for covering the upper side of the common source line 2420 or a conductive layer for a connection may be formed.

Figure 15:
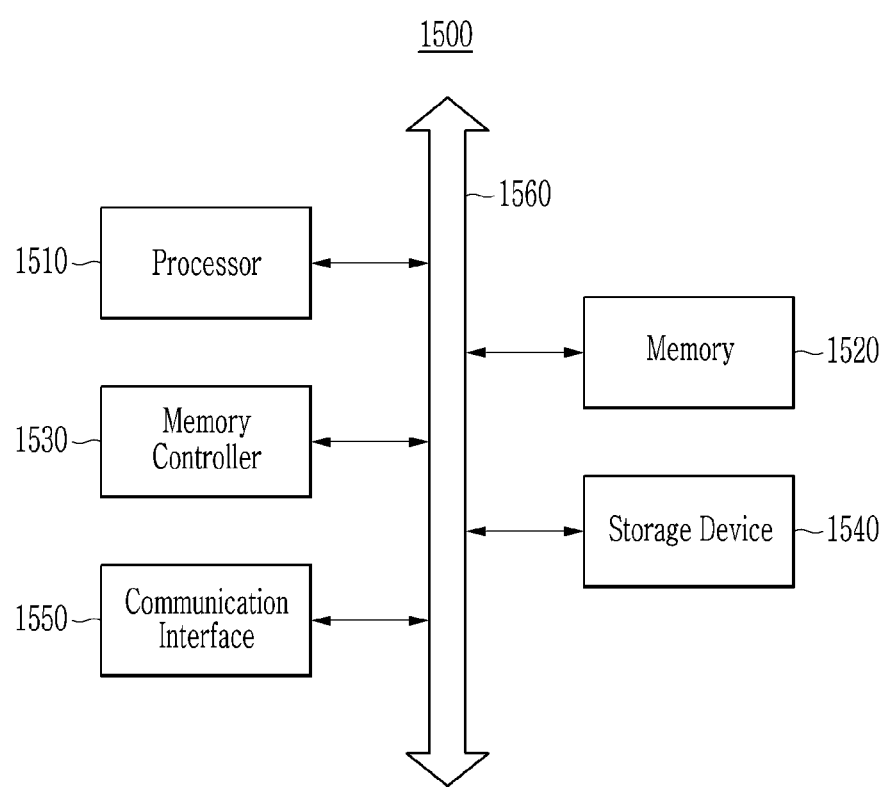
FIG. 15 shows a block diagram of a computer system according to an embodiment.

FIG. 15 shows a block diagram of a computer system according to an embodiment.

Referring to FIG. 15, the computing device 1500 includes a processor 1510, a memory 1520, a memory controller 1530, a storage device 1540, a communication interface 1550, and a bus 1560. The computing device 1500 may further include general-purpose constituent elements.

The processor 1510 controls general operations of the respective constituent elements of the computing device 1500. The processor 1510 may be realized with at least one of various processing units such as a central processing unit (CPU), an application processor (AP), or a graphics processing unit (GPU).

The memory 1520 stores various data and commands. The memory controller 1530 controls transmission of the data or commands to/from the memory 1520. In an embodiment, the memory controller 1530 may be provided as an individual chip that is not the processor 1510. In an embodiment, the memory controller 1530 may be provided as an internal constituent element of the processor 1510.

The storage device 1540 non-temporarily stores programs and data. In an embodiment, the storage device 1540 may be realized as a storage device including the page buffer circuit described with reference to FIG. 1 to FIG. 14. The communication interface 1550 supports wired/wireless network communication of the computing device 1500. The communication interface 1550 may support various communication methods in addition to the network communication. The bus 1560 provides a communication function among the constituent elements of the computing device 1500. The bus 1560 may include at least one type of bus according to a communication protocol among the constituent elements.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A non-volatile memory device comprising:
   a memory cell;
   a bit line connected to the memory cell;
   a first cross coupled inverter for storing data sensed from the memory cell through a sensing node connected to the bit line;
   a first transistor and a second transistor respectively connected to respective ends of the first cross coupled inverter and respectively transmitting a ground voltage to respective ends of the first cross coupled inverter;
   a third transistor connected among the first transistor, the second transistor, and a ground power; and
   a control circuit for operating the first transistor and the second transistor at least once during a period in which the third transistor is turned on, wherein at least one of an initialize period in which the sensing node is discharged and a precharge period in which the bit line is precharged comprises the period the third transistor is turned on.

2. The non-volatile memory device of claim 1, wherein:
   the third transistor is turned on for the initialize period, and the initialize period includes a first period in which the first transistor is turned on and a second period in which the second transistor is turned on after the first period.

3. The non-volatile memory device of claim 1, wherein:
the initialize period includes a first period in which the third transistor is turned on,
the precharge period includes a second period in which the third transistor is turn on,
the first period includes a period in which the first transistor is turned on, and
the second period includes a period in which the second transistor is turned on.

4. The non-volatile memory device of claim 1, further comprising:
a second cross coupled inverter for sensing data stored in the memory cell through the sensing node; and
a fourth transistor connected between the third transistor and a first end of the second cross coupled inverter and transmitting a ground voltage to a first end of the second cross coupled inverter; and
a fifth transistor connected between the third transistor and a second end of the second cross coupled inverter and transmitting the ground voltage to a second end of the second cross coupled inverter.

5. The non-volatile memory device of claim 4, wherein:
the third transistor is turned on in the initialize period, and
the initialize period includes a first period in which the first transistor and the fourth transistor are turned on and a second period in which the second transistor and the fifth transistor are turned on after the first period.

6. The non-volatile memory device of claim 5, wherein:
the initialize period includes a first period in which the third transistor is turned on,
the precharge period includes a second period in which the third transistor is turned on,
the first period includes a period in which the first transistor and the fourth transistor are turned on, and
the second period includes a period in which the second transistor and the fourth transistor are turned on.

7. The non-volatile memory device of claim 5, wherein:
the initialize period includes a first period in which the third transistor is turned on,
the precharge period includes a second period in which the third transistor is turned on,
the first period includes a third period in which the first transistor is turned on and a fourth period in which the second transistor is turned on after the third period, and
the second period includes a fifth period in which the fourth transistor is turned on and a sixth period in which the fifth transistor is turned on after the fifth period.

8. A non-volatile memory device comprising:
a memory cell;
a bit line connected to the memory cell;
a cross coupled inverter for storing data sensed from the memory cell through a sensing node connected to the bit line as a latch value;
a first transistor for connecting a first end of the cross coupled inverter to ground when the sensing node is connected to ground according to the latch value;
a second transistor for connecting a second end of the cross coupled inverter to ground when a voltage at the sensing node is maintained according to the latch value;
a third transistor connected among the first transistor, the second transistor, and a ground power;
a fourth transistor having a first end connected to the sensing node; and a fifth transistor connected between a second end of the fourth transistor and the ground power and controlled according to the latch value,
wherein the fourth transistor is turned on,
wherein the fifth transistor is turned on according to the latch value, so the voltage at the sensing node is discharged to ground,
wherein the third transistor and the first transistor are turned on, and
wherein the voltage at the first end of the cross coupled inverter is discharged to ground.

9. The non-volatile memory device of claim 8, further comprising a sixth transistor connected between a first end of the second transistor and the ground power and controlled by the voltage at the sensing node.

10. The non-volatile memory device of claim 9, wherein the fourth transistor is turned on, the fifth transistor is turned off according to a voltage at the first end of the cross coupled inverter to maintain the voltage at the sensing node, the third transistor and the first transistor are turned on to maintain the voltage at the first end of the cross coupled inverter as ground, the second transistor is turned on, and the sixth transistor is turned on according to the voltage at the sensing node to discharge the voltage at the second end of the cross coupled inverter to ground, so the voltage at the first end of the cross coupled inverter is inverted.

11. A method for driving a non-volatile memory device comprising:
connecting a sensing node, which is connected to a bit line of a memory cell, to ground and discharging the sensing node for an initialize period;
precharging the bit line for a precharge period;
sensing data stored in the memory cell by using a first cross coupled inverter connected to the sensing node;
turning on a third transistor connected between the ground and a first transistor and a second transistor connected to respective ends of the first cross coupled inverter and respectively transmitting a ground voltage to the respective ends of the first cross coupled inverter within at least one of the initialize period and the precharge period; and
respectively operating, at least once, the first transistor and the second transistor during the third transistor is turned on.

12. The method of claim 11, wherein:
the respectively operating, at least once, of the first transistor and the second transistor includes:
initializing a set terminal of the first cross coupled inverter for a first period within the initialize period; and
initializing a reset terminal of the first cross coupled inverter for a second period after the first period within the initialize period.

13. The method of claim 11, wherein:
the respectively operating, at least once, of the first transistor and the second transistor includes:
initializing a set terminal of the first cross coupled inverter for a first period within the initialize period; and
initializing a reset terminal of the first cross coupled inverter for a second period within the precharge period.

14. The method of claim 11, further comprising:
sensing data stored in the memory cell by using a second cross coupled inverter connected to the sensing node; and respectively operating, at least once, a fourth transistor and a fifth transistor connected to respective ends of the second cross coupled inverter and respectively transmitting a ground voltage to respective ends of the second cross coupled inverter within at least one of the initialize period and the precharge period.

15. The method of claim 14, wherein:
the respectively operating, at least once, of the first transistor and the second transistor includes:
  initializing a set terminal of the first cross coupled inverter for a first period within the initialize period; and
  initializing a reset terminal of the first cross coupled inverter for a second period after the first period within the initialize period, and
the respectively operating, at least once, of the fourth transistor and the fifth transistor includes:
  initializing a set terminal of the second cross coupled inverter for a third period within the initialize period; and
  initializing a reset terminal of the second cross coupled inverter for a fourth period after the third period within the initialize period.

16. The method of claim 14, wherein:
the respectively operating, at least once, of the first transistor and the second transistor includes:
  initializing a set terminal of the first cross coupled inverter for a first period within the initialize period; and
  initializing a reset terminal of the first cross coupled inverter for a second period within the precharge period, and
the respectively operating, at least once, of the fourth transistor and the fifth transistor includes:
  initializing a set terminal of the second cross coupled inverter for a third period within the initialize period; and
  initializing a reset terminal of the second cross coupled inverter for a fourth period within the precharge period.

17. The method of claim 14, further comprising:
initializing a value latched to the first cross coupled inverter by:
  initializing a set terminal of the first cross coupled inverter for a first period within the initialize period; and
  initializing a reset terminal of the first cross coupled inverter for a second period after the first period within the initialize period, wherein:
respectively operating, at least once, of the fourth transistor and the fifth transistor includes:
  initializing a set terminal of the second cross coupled inverter for a third period within the precharge period; and
  initializing a reset terminal of the second cross coupled inverter for a fourth period within the precharge period.

* * * * *